(12) United States Patent
Sato

(10) Patent No.: US 6,504,220 B2
(45) Date of Patent: Jan. 7, 2003

(54) SEMICONDUCTOR DEVICE

(75) Inventor: Kimitoshi Sato, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/986,881

(22) Filed: Nov. 13, 2001

(65) Prior Publication Data
US 2002/0179978 A1 Dec. 5, 2002

(30) Foreign Application Priority Data
May 29, 2001 (JP) ........................................ 2001-160809

(51) Int. Cl.[7] .............................................. H01L 29/76
(52) U.S. Cl. ...................... 257/380; 257/300; 257/381; 257/382; 257/383; 257/384; 257/385; 257/386; 257/533; 257/538; 438/300
(58) Field of Search ................................. 257/380, 381, 257/382, 383, 384, 385, 386, 533, 538; 438/300

(56) References Cited

U.S. PATENT DOCUMENTS

| | | | | |
|---|---|---|---|---|
| 4,528,582 A | * | 7/1985 | Cohen et al. ................. 357/51 |
| 5,034,797 A | * | 7/1991 | Yamanaka et al. ............. 357/42 |
| 5,554,873 A | * | 9/1996 | Erdeljac et al. .............. 257/380 |
| 5,684,323 A | * | 11/1997 | Tohyama ..................... 257/363 |
| 5,751,050 A | * | 5/1998 | Ishikawa et al. ............. 257/538 |
| 6,359,339 B1 | * | 3/2002 | Gregor et al. ............... 257/757 |

* cited by examiner

Primary Examiner—Jerome Jackson
Assistant Examiner—Edgardo Ortiz
(74) Attorney, Agent, or Firm—McDermott, Will & Emery

(57) ABSTRACT

A semiconductor device comprises a first insulating layer formed on a substrate; a resistor layer formed on the first insulating layer and having a prescribed electrical resistance; a second insulating layer formed on the resistor layer; a plurality of wirings electrically connected, at positions spaced apart from each other on the resistor layer, to the resistor layer through holes formed in the second insulating layer. Further the semiconductor device comprises a heat storage layer formed in the vicinity of the resistor layer for storing heat generated when a current flows in the resistor layer Hence, even if a large current such as a surge current flows in the resistor layer, heat generated in the resistor layer can be stored in the heat storage layer provided in the vicinity of the resistor layer. Therefore, a stable and reliable semiconductor device free of the breakdown of the resistor layer can be provided.

20 Claims, 17 Drawing Sheets

SEMICONDUCTOR DEVICE

BACKGROUND OF THE INVENTION

1. Field of the Invention

The present invention relates to a semiconductor device, and more particularly to a semiconductor device having an electric resistor portion such as a polysilicon resistor layer.

2. Background Art

A conventional semiconductor device will be described below referring to FIGS. 15 to 17.

FIG. 15 is a schematic sectional view of a conventional semiconductor device having a polysilicon resistor layer. In FIG. 15, the reference numeral 1 represents a p⁻-substrate as a substrate, 2 represents an n⁺-diffused layer, 3 represents a p⁺-diffused layer, 4 represents an n⁻-epitaxial layer formed on the n⁺-diffused layer 2 and the p⁺-diffused layer 3, 5 represents an n⁻-diffused layer, 6 represents a p+-diffused layer diffused from the surface of the formed n⁻-epitaxial layer 4 so as to extend to the p⁺-diffused layer 3, 8 represents an LOCOS (local oxidation of silicon) oxide film as a first insulating layer, 9 represents a p-layer formed on the p⁺-diffused layer 6, 16 represents p⁺-diffused layers formed by implantation immediately underneath the wiring, 17 represents an oxide film layer as a second insulating layer, 18 represents contact holes formed in the oxide film layer 17, 19 represents aluminum electrodes as wirings formed on the polysilicon resistor layer through the contact holes 18, and 20 represents a polysilicon resistor layer as a resistor layer.

Here, the polysilicon resistor layer 20 is formed by adding an impurity, such as boron, to polysilicon, and the quantity of the impurity is adjusted to obtain a desired electric resistance to control the current flowing through the polysilicon resistor layer 20. Furthermore, each of the LOCOS oxide film 8 and the oxide film layer 17 has a thickness sufficient to insulate current flowing through the polysilicon resistor layer 20 from flowing outwardly. Also, two aluminum electrodes 19 are electrically connected to the polysilicon resistor layer 20 at positions spaced apart from each other through the p⁺-diffused layers 16.

As described above, the portion constituted by the aluminum electrode 19, the p⁺-diffused layers 16, the polysilicon resistor layer 20, the LOCOS oxide film 8, and the oxide film layer 17 functions as the so-called electric resistor portion of the semiconductor device.

Next, a method for manufacturing the conventional semiconductor device will be described below referring to FIGS. 16a to 16d and 17a to 17c. FIGS. 16a to 16d are schematic sectional views showing the semiconductor device in each of conventional manufacturing process steps; and FIGS. 17a to 17c are schematic sectional views showing the semiconductor device in each of the continuing manufacturing process steps. The semiconductor device shown in each drawing includes a CMOS transistor portion in addition to the above-described electric resistor portion.

First, as FIG. 16a shows, after an oxide film is formed on the surface of the p⁻-substrate 1, photoengraving is performed to remove the unnecessary part of the oxide film on the p⁻-substrate 1. Antimony is implanted into the area from which the oxide film has been removed, and is driven (pushed) at 1240° C. to form an n⁺-diffused layer 2. Thereafter, the oxide film remaining on the p⁻-substrate 1 is removed.

Then, after an oxide film of a thickness of several ten nanometers has been formed, photoengraving is performed to remove the unnecessary part of the oxide film. Boron is implanted into the area from which the oxide film has been removed, and is driven at 1150° C. to form a p⁺-diffused layer 3. Thereafter, the oxide film remaining on the p⁻-substrate 1 is removed.

Then, on the p⁻-substrate 1, on which the n⁺-diffused layer 2 and the p⁺-diffused layer 3 have been formed, a p⁻-epitaxial layer 4 is formed so as to cover the n⁺-diffused layer 2 and the p⁺-diffused layer 3.

Next, as FIG. 16b shows, an oxide film of a thickness of several ten nanometers is formed on the p⁻-epitaxial layer 4, a nitride film is deposited thereon, and photoengraving is performed to remove the unnecessary part of the nitride film. Phosphorus is implanted into the area from which the nitride film has been removed, and an oxidation treatment is performed at 950° C. to form an oxide film 7 and n⁻-diffused layers 5. Here, a part of the n⁻-diffused layers 5 (n⁻-diffused layer 5 on the right-hand side of the drawing) functions as a part of a p-channel MOS transistor described later.

Then, after the nitride film remaining on the topmost surface of the p⁻-substrate 1 has been removed, boron is implanted and is driven at 1180° C. to form a p⁺-diffused layer 6. Here, a part of the p⁺-diffused layers 6 (p⁺-diffused layer 6 on the right-hand side of the drawing) functions as a part of an n-channel MOS transistor described later.

Next, as FIG. 16c shows, after the oxide film 7 on the n⁻-diffused layer 5 and the oxide film on the p⁺-diffused layer 6 and the n⁻-epitaxial layer 4 have been removed, an oxide film of a thickness of several ten nanometers is formed thereon. Then, after a nitride film has been deposited on the oxide film, photoengraving is performed to remove the unnecessary nitride film, and an LOCOS oxide film 8 of a thickness of about 400 nm is formed on the area from which the nitride film has been removed.

Then, after a resist has been applied to the surface, photoengraving is performed to remove the unnecessary part of the resist, and boron is implanted into the area from which the resist has been removed to form a p-layer 9 on the p⁺-diffused layer 6.

Next, as FIG. 16d shows, a polysilicon film is deposited on the topmost surface of the p⁻-substrate 1, and an impurity such as boron is implanted into the entire surface of the polysilicon film. Then, a resist is applied to the impurity-implanted polysilicon film, and patterning is performed to form a desired polysilicon resistor layer 20.

Next, as FIG. 17a shows, the oxide film formed on the topmost surface of the p⁻-substrate 1, and a thickness of several ten nanometers of the LOCOS oxide film 8 are removed. Then, on the n⁻-diffused layer 5 and the p-layer 9, corresponding to the CMOS transistor portion, an oxide film (gate oxide film) 10 of a thickness of 10 to 50 nm is formed.

On the oxide film 10, a polysilicon film 11 and a tungsten silicide film 12 are sequentially deposited. Furthermore, a resist is applied thereon, and patterning is performed to remove unnecessary parts of polysilicon film 11 and tungsten silicide film 12. Thereby, the gate electrode portion of the CMOS transistor is formed.

Thereafter, the resist is applied thereon, patterning is performed, and phosphorus is rotationally implanted by an angle of 45°, to form an n⁻-diffused layer 13 on the p-layer 9. Here the n⁻-diffused layer 13 is formed in the n-channel portion of the CMOS transistor.

Next, as FIG. 17b shows, the resist applied to the topmost surface in the previous process is removed, and an oxide film is deposited on the area from which the resist has been removed. Then, anisotropic etching is performed to form sidewalls 14 on the sides of the gate electrode portion comprising a polysilicon film 11 and a tungsten silicide film 12 formed in the previous process.

Then, after photoengraving is performed, arsenic is implanted into a part of the n⁻-diffused layer 13 and is driven at 900° C. in a nitrogen atmosphere to form an n⁺-diffused layer 15. Here, the n⁺-diffused layer 15 functions as the n-channel source/drain region.

Then, in a p-channel side part of the n⁻-diffused layer 5, $BF_2$ is implanted to form a p⁺-diffused layer 16. Here, the p⁺-diffused layer 16 functions as the p-channel source/drain region, and also improves ohmic contact with the polysilicon resistor layer 20.

Finally as FIG. 17c shows, an oxide film layer 17 of a thickness of about 800 nm is formed on the topmost surface of the p⁻-substrate 1. Then, photoengraving is performed to remove the unnecessary parts of the oxide film layer 17, and to form desired contact holes 18. Then, an aluminum film is formed on the entire topmost surface by sputtering, and photoengraving is performed to remove the unnecessary parts of the aluminum film. Thereby, desired aluminum electrodes 19 are formed. Here, among six aluminum electrodes 19 formed in this process, two from the right of the drawing become the p-channel source/drain electrodes of the CMOS transistor, two in the center of the drawing become the n-channel source/drain electrodes, and two from the left of the drawing become the electrodes for resistors.

The above-described conventional semiconductor device has a problem in that when a surge current flows in the polysilicon resistor layer of the resistor portion, the polysilicon resistor layer is heated and may be broken. This is because the oxide film and the LOCOS oxide film of as thick as several hundred nm surround the polysilicon resistor layer. Since these oxide films has a relatively low thermal conductivity, a large quantity of heat produced in the polysilicon resistor layer due to surge current cannot be conducted instantaneously. If the polysilicon resistor layer is broken due to heat, the original role as an electric resistance cannot be played.

SUMMARY OF THE INVENTION

An object of the present invention is to solve the above-described problem, and to provide a stable and reliable semiconductor device of which the polysilicon resistor layer is not broken even if a large quantity of current, such as a surge current, flows in the polysilicon resistor layer.

According to one aspect of the present invention, a semiconductor device comprises a first insulating layer formed on a substrate; a resistor layer formed on the first insulating layer and having a prescribed electrical resistance; a second insulating layer formed on the resistor layer; a plurality of wirings electrically connected, at positions spaced a part from each other on the resistor layer, to the resistor layer through holes formed in the second insulating layer; and a heat storage layer formed in the vicinity of the resistor layer for storing heat generated when a current flows in the resistor layer.

Other and further objects, features and advantages of the invention will appear more fully from the following description.

DETAILED DESCRIPTION OF THE PREFERRED EMBODIMENTS

The embodiments of the present invention will be described in detail below.

First Embodiment

First Embodiment of the present invention will be described in detail below referring to FIGS. 1 to 3.

Figure 1:
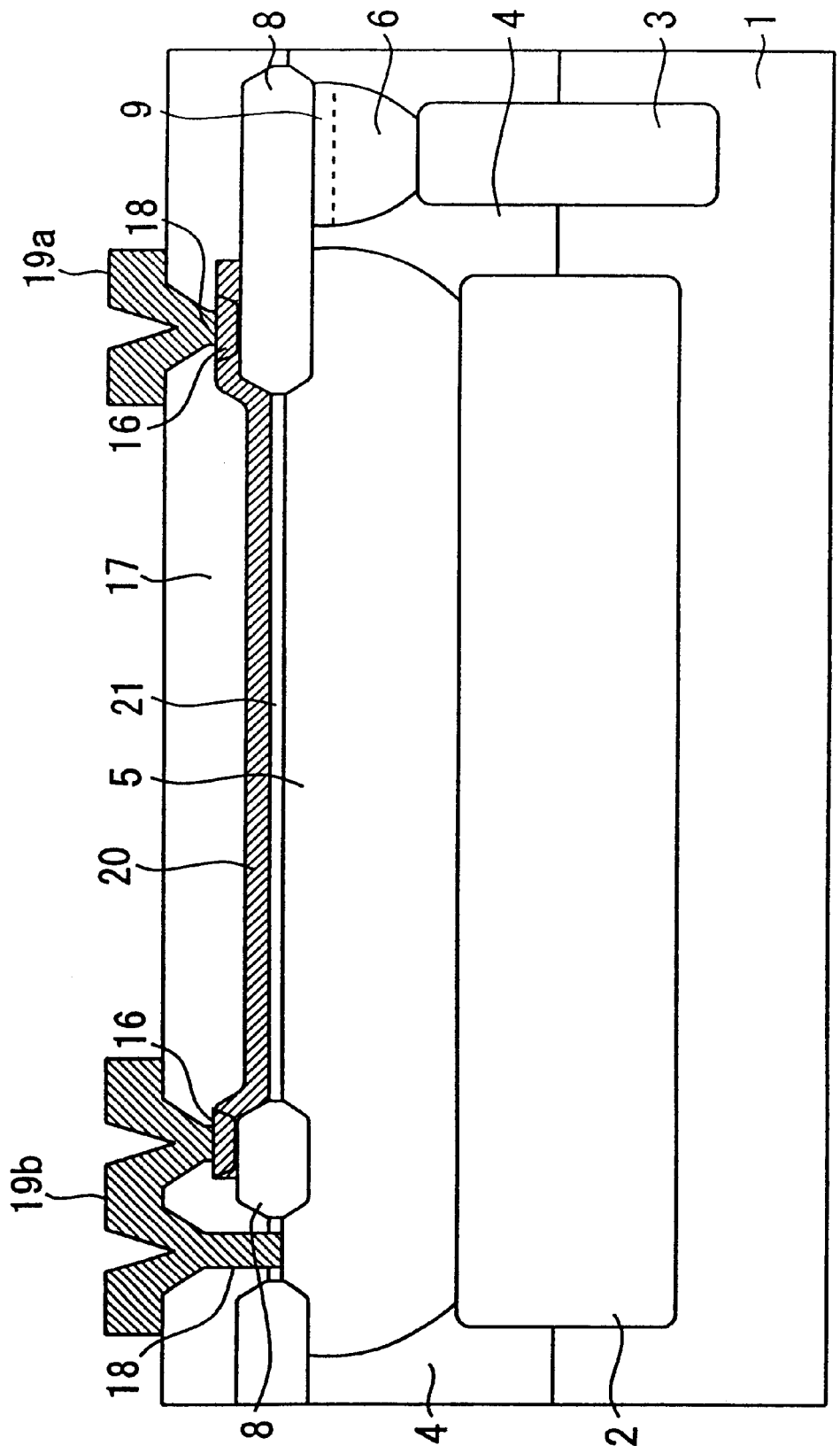
FIG. 1 is a schematic sectional view showing a semiconductor device of First Embodiment.

FIG. 1 is a schematic sectional view showing a semiconductor device of First Embodiment. In FIG. 1, the reference numeral 1 represents a p⁻-substrate as a substrate, 2 represents an n⁺-diffused layer, 3 represents a p⁺-diffused layer, 4 represents an n⁻-epitaxial layer, 5 represents an n⁻-diffused layer (impurity-diffused layer) as a heat storage layer, 6 represents a p⁺-diffused layer, 8 represents an LOCOS oxide: film, 9 represents a p-layer, 16 represents p⁺-diffused layers formed immediately underneath the wiring, 17 represents an oxide film layer as a second insulating layer, 18 represents contact holes formed in the oxide film layer 17, 19a represents aluminum electrodes as wirings electrically connected to the polysilicon resistor layer through the contact holes 18, 19b represents aluminum electrodes as wirings electrically connected to the polysilicon resistor layer and the n⁻-diffused layer 5 through the contact holes 18, 20 represents a polysilicon resistor layer as an resistor layer of a prescribed electric resistance, and 21 represents an underlying oxide film as a thin film insulating layer portion.

In First Embodiment, the LOCOS oxide film 8 and the underlying oxide film 21 constitute a first insulating layer.

Here, the thickness of each of the LOCOS oxide film 8 and the oxide layer film 17 is several hundred nanometers, while the thickness of the underlying oxide film 21 contacting substantially the entire bottom surface of the polysilicon resistor layer 20 is several ten nanometers. Furthermore, the n⁻-diffused layer 5 having a relatively high thermal conductivity contacts the bottom surface of the underlying oxide film 21. This n⁻-diffused layer 5 is an impurity-diffused layer formed on a part of the p⁻-substrate 1 facing the polysilicon resistor layer 20.

In the semiconductor device constituted as described above, when a current flows in the polysilicon resistor layer 20 through the p⁺-diffused layer 16, no current flows toward the upper surface side, because the oxide layer 17 of a sufficient thickness has been formed on the upper surface side of the polysilicon resistor layer 20. Also, although the underlying oxide film 21 of low insulation is formed on the bottom surface side of the polysilicon resistor layer 20, the n⁻-diffused layer 5 underneath the underlying oxide film 21 is maintained at the same potential as the polysilicon resistor layer 20 by the aluminum electrode 19b, no current flows also toward the bottom surface side. Therefore, the structure as an electric resistance according to First Embodiment plays a role of an inherent electric resistance sufficiently.

Also, even if a surge current flows in the polysilicon resistor layer 20, and a large heat is generated in the polysilicon resistor layer 20, the underlying oxide film 21, which has a low thermal conductivity, can dissipate the heat to the n⁻-diffused layer 5 because the underlying oxide film 21 has been formed to be extremely thin. Thereby, the heat generated in the polysilicon resistor layer 20 is dissipated, and the temperature of the polysilicon resistor layer 20 becomes difficult to elevate.

Next, a method for manufacturing a semiconductor of First Embodiment will be described below referring to FIGS. 2a to 2d and 3a to 3c. FIGS. 2a to 2d are schematic sectional views showing the semiconductor device in each of the manufacturing process step, and FIGS. 3a to 3c are schematic sectional views showing the semiconductor device in each of the continuing manufacturing process steps. The semiconductor device shown in each drawing includes a CMOS transistor portion in addition to the above-described electric resistor portion.

Figure 2A:
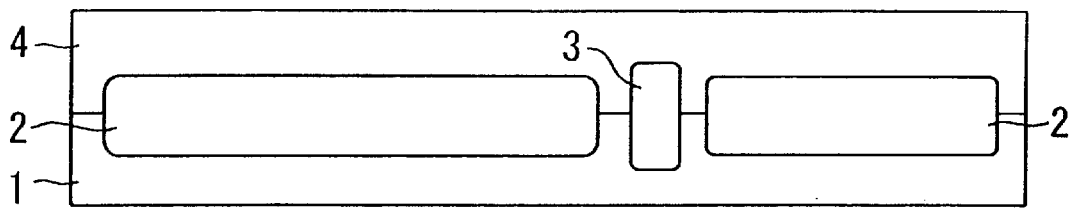
FIGS. 2a to 2d are schematic sectional views showing the semiconductor device in each of the manufacturing process step.
Figure 3A:
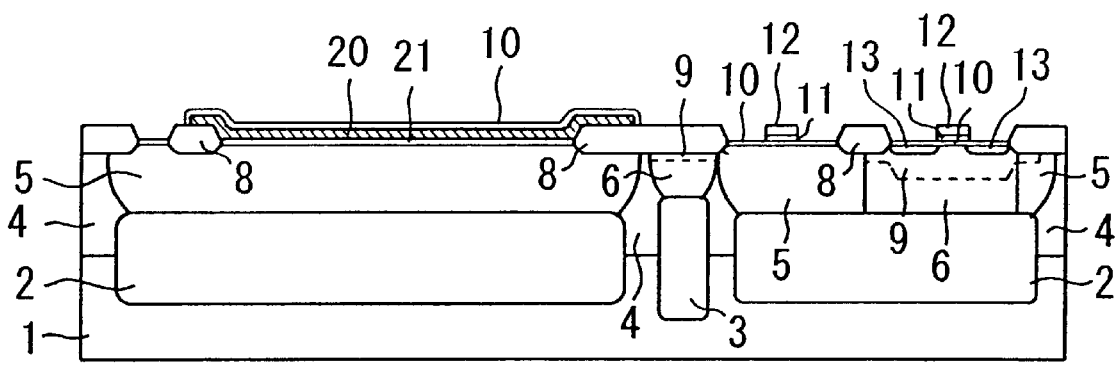
FIGS. 3a to 3c are schematic sectional views showing the semiconductor device in each of the continuing manufacturing process steps.
Figure 3B:
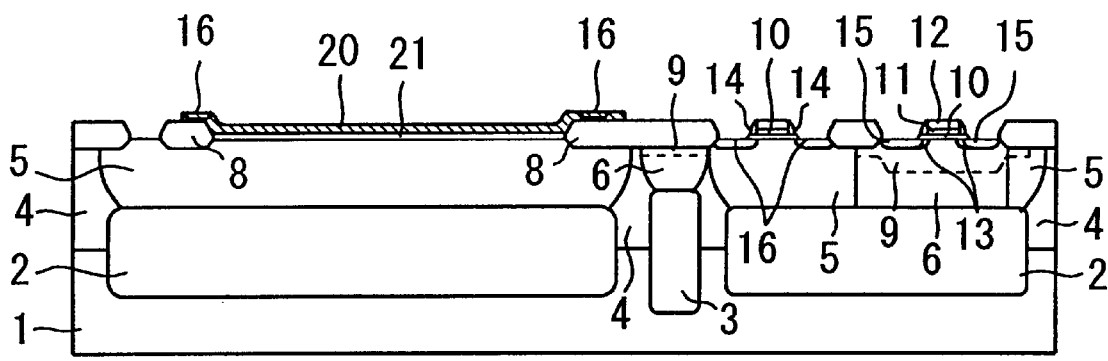
Figure 3C:
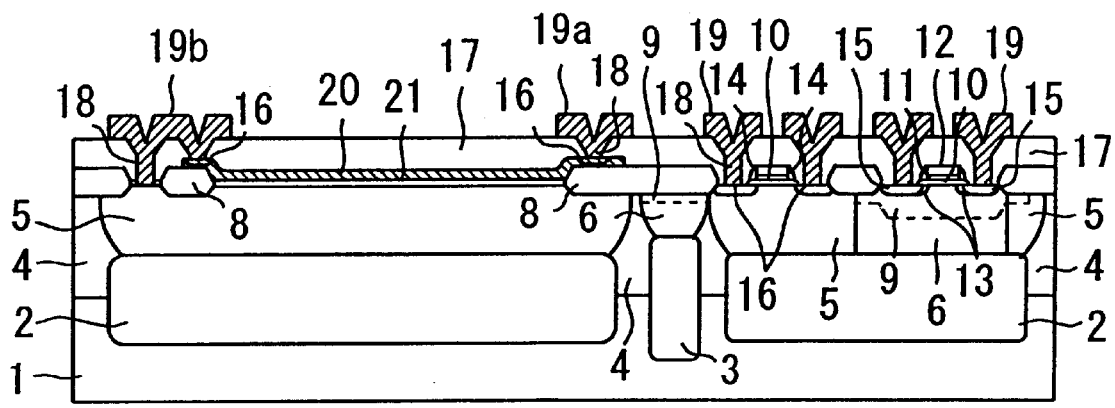

First, as FIG. 2a shows, after an oxide film has been formed on the surface of a p⁻-substrate 1, photoengraving is performed to remove the unnecessary part of the oxide film on the surface of a p⁻-substrate 1. Antimony is implanted into the area from which the oxide film has been removed, and is driven (pushed) at 1240° C. to form an n⁺-diffused layer 2. Thereafter, the oxide film remaining on the p⁻-substrate 1 is removed.

Then, after an oxide film of a thickness of several ten nanometers has been formed, photoengraving is performed to remove the unnecessary part of the oxide film. Boron is implanted into the area from which the oxide film has been removed, and is driven at 1150° C. to form a p⁻-diffused layer 3. Thereafter, the oxide film remaining on the p⁻-substrate 1 is removed.

Then, on the p⁻-substrate 1, on which the n⁺-diffused layer 2 and the p⁺-diffused layer 3 have been formed, a p⁻-epitaxial layer 4 is formed so as to cover the n⁺-diffused layer 2 and the p⁺-diffused layer 3.

Figure 2B:
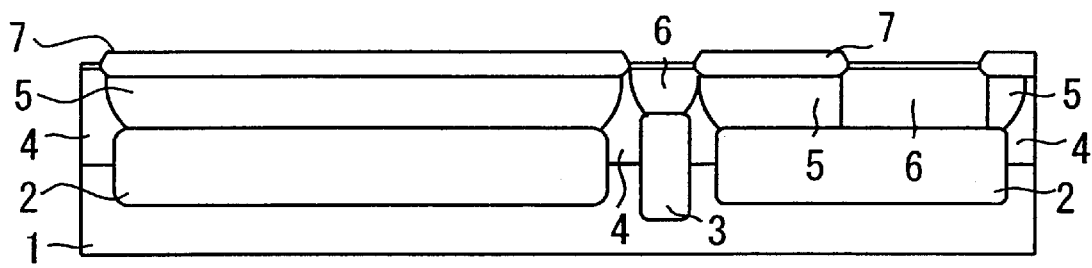

Next, as FIG. 2b shows, an oxide film of a thickness of several ten nanometers is formed on the p⁻-epitaxial layer 4, a nitride film is deposited thereon, and photoengraving is performed to remove the unnecessary part of the nitride film. Phosphorus is implanted into the area from which the nitride film has been removed, and an oxidation treatment is performed at 950° C. to form an oxide film 7 and n⁻-diffused layers 5 are formed. Here, a part of the n⁻-diffused layers 5 (n⁻-diffused layer 5 on the right-hand side of the drawing) functions as a part of a p-channel MOS transistor described later.

Then, after the nitride film remaining on the topmost surface of the p⁻-substrate has been removed, boron is implanted and is driven at 1180° C. to form a p⁺-diffused layer 6. Here, a part of the p⁺-diffused layers 6 (p⁺-diffused layer 6 on the right-hand side of the drawing) functions as a part of an n-channel MOS transistor described later.

Figure 2C:
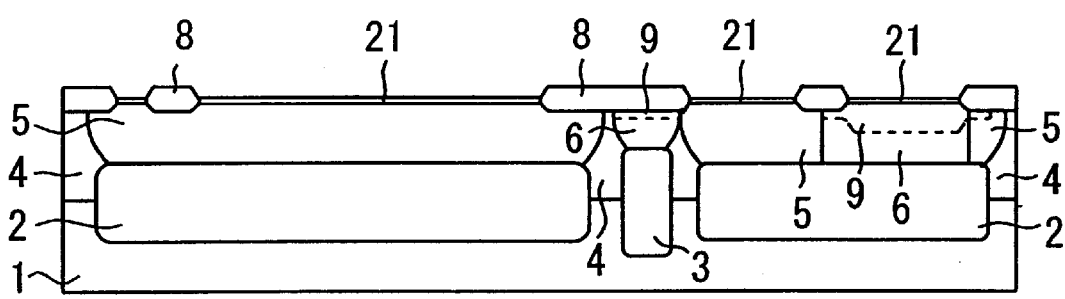

Next, as FIG. 2c shows, after the oxide film 7 on the n⁻-diffused layer 5 and the oxide film on the p⁺-diffused layer 6 and the n⁻-epitaxial layer 4 have been removed, an oxide film of a thickness of several ten nanometers is formed thereon. Then, after a nitride film has been deposited on the oxide film, photoengraving is performed to remove the unnecessary part of the nitride film, and an LOCOS oxide film 8 of a thickness of about 400 nm is formed on the area from which the nitride film has been removed.

Then, the oxide film and the nitride film on the topmost surface are removed, and an underlying oxide film 21 of a thickness of several ten nanometers is formed there.

Then, after a resist has been applied to the topmost surface, photoengraving is performed to remove the unnecessary part of the resist, and boron is implanted into the area from which the resist has been removed to form a p-layer 9 on the p⁺-diffused layer 6.

Figure 2D:
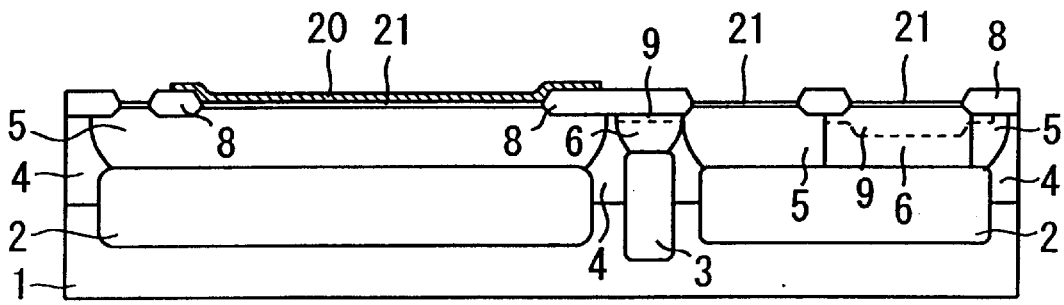

Next, as FIG. 2d shows, a polysilicon film is deposited on the topmost surface of the p⁻-substrate 1, and an impurity such as boron is implanted into the entire surface of the polysilicon film. Then, a resist is applied to the impurity-implanted polysilicon film, and patterning is performed to form a desired polysilicon resistor layer 20.

Next, as FIG. 3a shows, while not removing a part of the underlying oxide film 21 which is in contact with the polysilicon resistor layer 20, another underlying oxide film 21 exposing to the topmost surface of the p⁻-substrate 1 is removed, and a thickness of several ten nanometers of the LOCOS oxide film 8 are removed. Then, on the n⁻-diffused layer 5 and the p-layer 9, corresponding to the CMOS transistor portion, an oxide film (gate oxide film) 10 of a thickness of 10 to 50 nm is formed.

On the oxide film 10, a polysilicon film 11 and a tungsten silicide film 12 are sequentially deposited. Furthermore, a resist is applied thereon, and patterning is performed to remove unnecessary part of the polysilicon film 11 and tungsten silicide film 12. Thereby, the gate electrode portion of the CMOS transistor is formed.

Thereafter, the resist is applied thereon, patterning is performed, and phosphorus is rotationally implanted by 45°, to form an n⁻-diffused layer 13 on the p-layer 9. Here the n⁻-diffused layer 13 is formed in the n-channel portion of the CMOS transistor.

Next, as FIG. 3b shows, the resist applied to the topmost surface in the previous process is removed, and an oxide film is deposited on the area from which the resist has been removed. Then, anisotropic etching is performed to form sidewalls 14 on the sides of the gate electrode portion comprising a polysilicon film 11 and a tungsten silicide film 12 formed in the previous process.

Then, after photoengraving has been performed, and arsenic is implanted in a part of the n⁻-diffused layer 13, and is driven in a nitrogen atmosphere at 900° C. to form an n⁺-diffused layer 15. Here, the n⁺-diffused layer 15 functions as the n-channel source/drain region.

Then, in a p-channel side part of the n⁻-diffused layer 5, $BF_2$ is implanted to form a p⁺-diffused layer 16. Here, the p⁺-diffused layer 16 functions as the p-channel source/drain region.

Finally as FIG. 3c shows, an oxide film layer 17 of a thickness of about 800 nm is formed on the topmost surface of the p⁻-substrate 1. Then, photoengraving is performed to remove the unnecessary parts of the oxide film layer 17, and to form desired contact holes 18. Then, an aluminum film is formed on the entire topmost surface by sputtering, and photoengraving is performed to remove the unnecessary parts of the aluminum film. Thereby, desired aluminum electrodes 19 are formed. Here, among six aluminum electrodes 19 formed in this process, two from the right of the drawing become the p-channel source/drain electrodes of the CMOS transistor, two in the center of the drawing become the n-channel source/drain electrodes, and two from the left of the drawing become the electrodes for resistors.

According to First Embodiment, as described above, even if a surge current flows in the polysilicon resistor layer 20, since the heat generated therein is stored in the n⁻-diffused layer 5, a stable and reliable semiconductor device that has an electric resistor portion resistant to the breakdown of the polysilicon resistor layer 20 can be provided.

Also, such a semiconductor device can be manufactured in relatively simple manufacturing process steps together with the process for forming a CMOS transistor.

Also in First Embodiment, although an underlying oxide film 21 is formed after the LOCOS oxide film 8 has been formed, an oxide film having a thickness of several ten nanometers formed before the LOCOS oxide film 8 is formed can be used as the underlying oxide film 21. In this case, the same effects as in First Embodiment can also be obtained.

Also in First Embodiment, an underlying oxide film 21 as a thin-film insulating portion is formed on the bottom surface of the polysilicon resistor layer 20, and the n⁻-diffused layer 5 is formed underneath the underlying oxide film 21. Alternatively, the thin-film insulating portion may be formed on the top surface of the polysilicon resistor layer 20, and the heat storage layer may further be formed on the top surface of the thin-film insulating portion.

Also in First Embodiment, although a polysilicon resistor layer 20 is used as the resistor layer, the present invention is also applicable to other resistor layers such as a diffused resistor layer.

While in First Embodiment, an n⁻-diffused layer 5 is used as the heat storage layer, the present invention is also applicable to other materials that have high thermal conductivity.

Also in First Embodiment, although a diffused layer formed immediately under aluminum electrodes 19a and 19b is used as the p-type diffused layer, the present invention is also applicable to an n-type diffused layer.

Second Embodiment

Second Embodiment of the present invention will be described in detail below referring to FIGS. 4 to 6.

Figure 4:
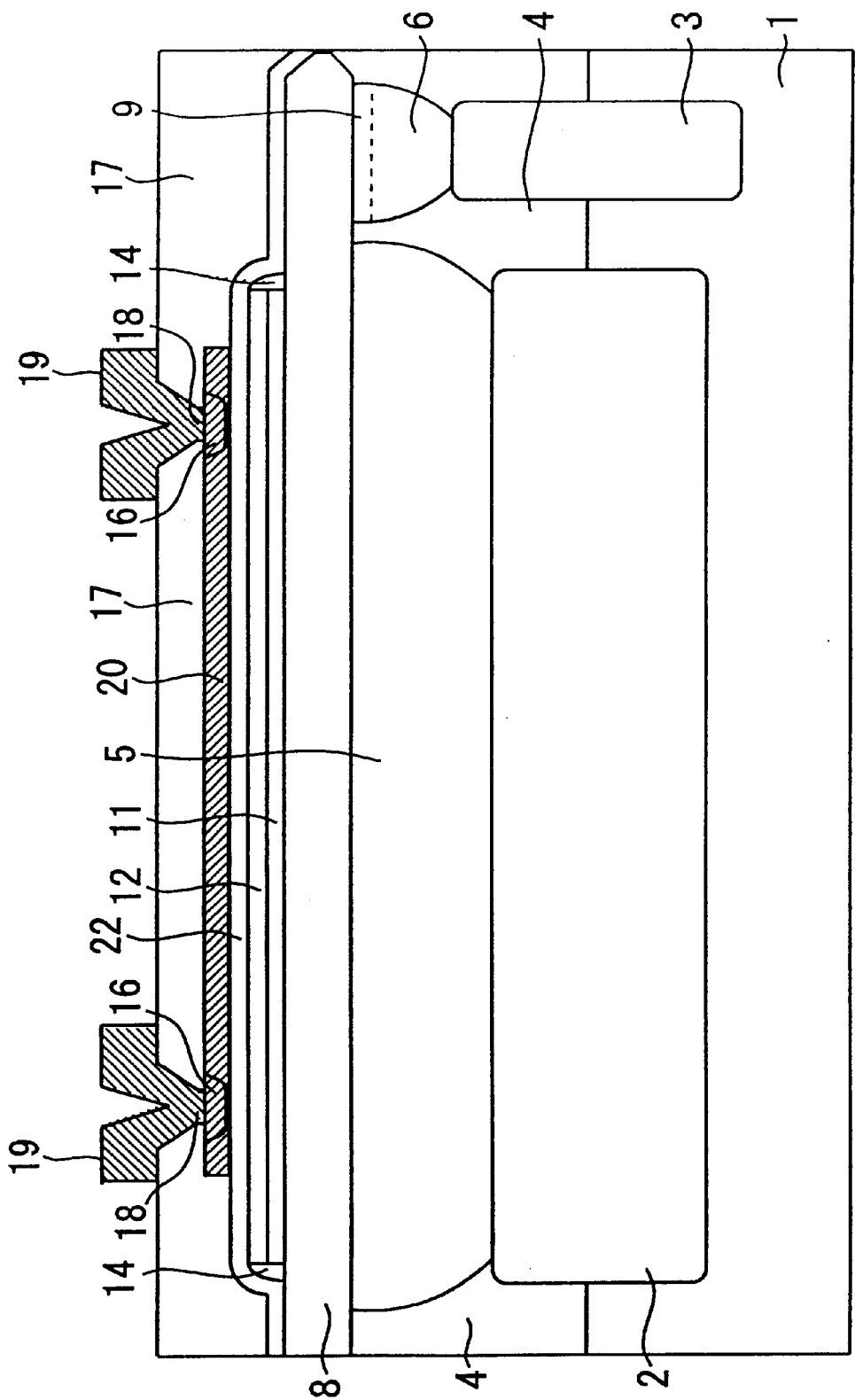
FIG. 4 is a schematic sectional view showing a semiconductor device of Second Embodiment.

FIG. 4 is a schematic sectional view showing a semiconductor device of Second Embodiment. In FIG. 4, the reference numeral 1 represents a p⁻-substrate; 2 represents an n⁺-diffused layer; 3, 6, and 16 represent p⁺-diffused layers; 4 represents an n⁻-epitaxial layer; 5 represents an n⁻-diffused layer; 8 represents an LOCOS oxide film; 9 represents a p-layer; 11 represents a polysilicon layer; 12 represents a tungsten silicide film as a silicide film; 14 represents sidewalls; 17 represents an oxide film layer as a second insulating layer; 18 represents contact holes; 19 represents aluminum electrodes as wirings electrically connected to the polysilicon resistor layer through the contact holes 18; 20 represents a polysilicon resistor layer as an resistor layer; and 22 represents an oxide film as a thin film insulating layer portion.

In Second Embodiment, the thin film insulating layer portion of the oxide film 22 constitutes the first insulating layer.

Here, the thickness of the oxide film layer 17 is several hundred nanometers, while the thickness of the oxide layer 22 contacting the entire bottom surface of the polysilicon resistor layer 20 is several ten nanometers. Furthermore, a laminated film (the laminated gate electrode structure) having a relatively high thermal conductivity consisting of a polysilicon film 11 and a tungsten silicide film 12 contacts the bottom surface of the oxide layer 22.

As described above, the semiconductor device according to Second Embodiment is a semiconductor device comprising an LOCOS oxide film (first insulating layer) 8 formed on a p⁻-substrate 1; a polysilicon resistor layer 20 having a prescribed electric resistance formed on the LOCOS oxide film 8; an oxide film layer (second insulating layer) 17 formed on the polysilicon resistor layer 20; and a plurality of aluminum electrodes (wirings) 19 electrically connected, at positions spaced part from each other on the polysilicon resistor layer 20, to the polysilicon resistor layer 20 through contact holes 18 formed in the oxide film layer 17; an oxide film (thin film insulating layer portion) 22 contacting the bottom surface of the polysilicon resistor layer 20; and a laminated film (heat storage layer) consisting of a polysilicon film 11 and a tungsten silicide film 12 contacting the bottom surface of the oxide layer 22.

In the semiconductor device constituted as described above, when a current flows in the polysilicon resistor layer 20 through the p⁺-diffused layer 16, no current flows toward the upper surface side, because the oxide layer 17 of a sufficient thickness has been formed on the upper surface side of the polysilicon resistor layer 20. Also, although the oxide film 22 of low insulation is formed on the bottom surface side of the polysilicon resistor layer 20, since the laminated film is formed underneath the oxide film 22, and furthermore, the LOCOS oxide film 8 of a sufficient thickness is formed underneath the laminated film, no current flows also toward the bottom surface side. Therefore, the structure as an electric resistance according to Second Embodiment plays a role of an inherent electric resistance sufficiently.

Also, even if a surge current flows in the polysilicon resistor layer 20, and a large heat is generated in the polysilicon resistor layer 20, the oxide film 22, which has a low thermal conductivity, can dissipate the heat to the tungsten silicide film 12 and the polysilicon film 11, because the oxide film 22 has been formed to be extremely thin. Thereby, the heat generated in the polysilicon resistor layer 20 is dissipated, and the temperature of the polysilicon resistor layer 20 becomes difficult to elevate.

Figure 5A:
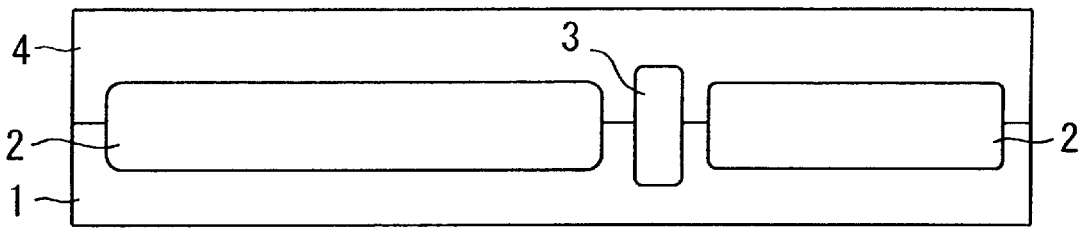
FIGS. 5a to 5d are schematic sectional views showing the semiconductor device in each of the manufacturing process step.
Figure 5B:
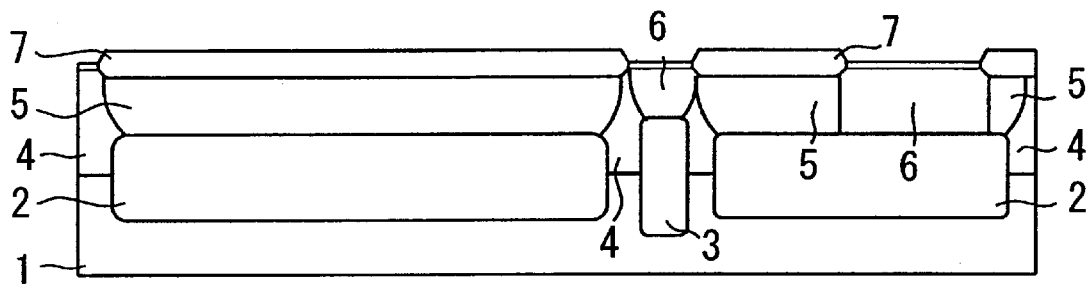

Next, a method for manufacturing a semiconductor of Second Embodiment will be described below referring to FIGS. 5a to 5d and 6a to 6c. FIGS. 5a to 5d are schematic sectional views showing the semiconductor device in each of the manufacturing process step, and FIGS. 6a to 6c are schematic sectional views showing the semiconductor device in each of the continuing manufacturing process steps.

First, in the process steps shown in FIGS. 5a to 5d are the same as the process steps shown in FIGS. 2a to 2d for First Embodiment.

Figure 5C:
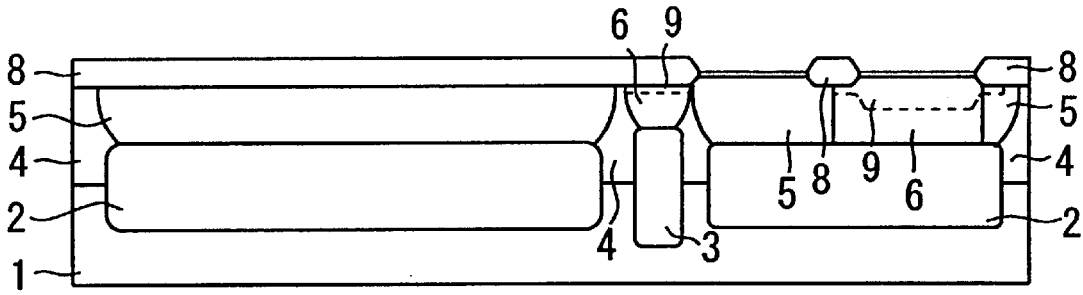
Figure 6A:
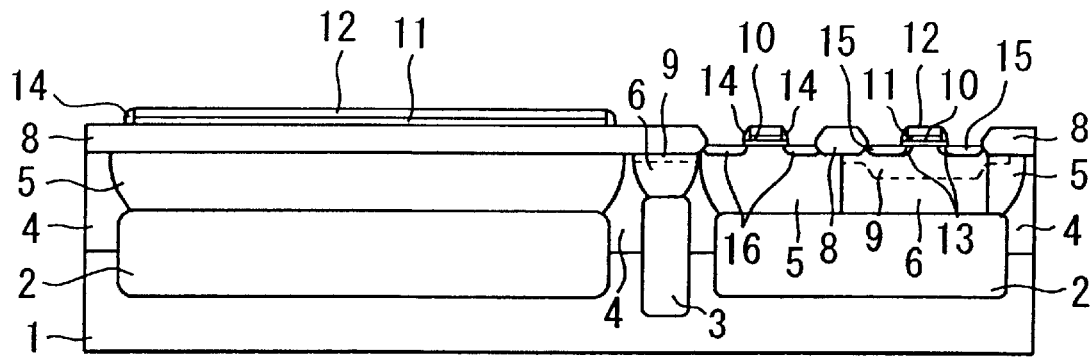
FIGS. 6a to 6c are schematic sectional views showing the semiconductor device in each of the continuing manufacturing process steps.
Figure 6B:
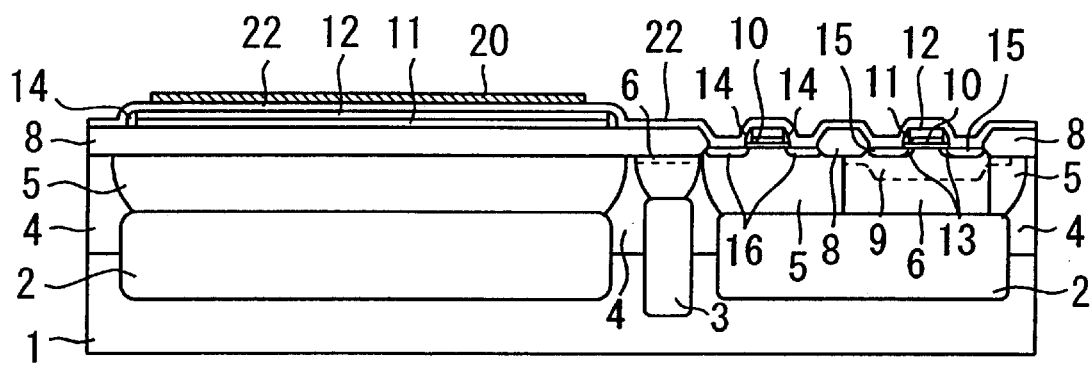
Figure 6C:
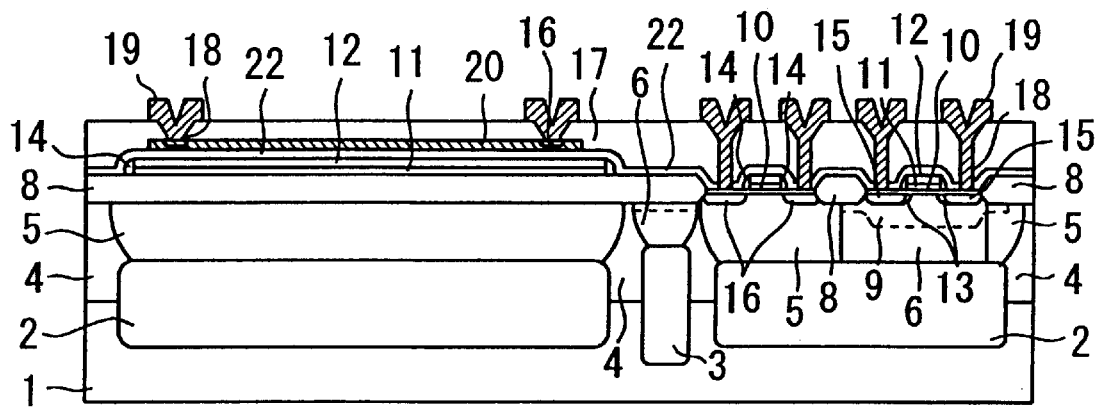

Next, as FIG. 5c shows, after the oxide film 7 on the n⁻-diffused layer 5 and the oxide film on the p⁺-diffused layer 6 and the n⁻-epitaxial layer 4 have been removed, an oxide film of a thickness of several ten nanometers is formed thereon. Then, after a nitride film has been deposited on the oxide film, photoengraving is performed to remove the unnecessary part of the nitride film, and an LOCOS oxide film 8 of a thickness of about 400 nm is formed on the area from which the nitride film has been removed.

Then, after a resist has been applied to the topmost surface, photoengraving is performed to remove the unnecessary part of the resist, and boron is implanted into the area from which the resist has been removed to form a p-layer 9 on the p⁺-diffused layer 6.

Figure 5D:
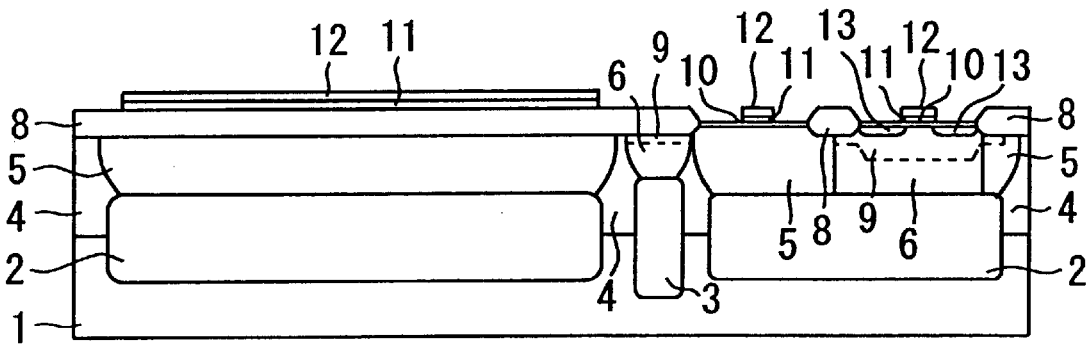

Next, as FIG. 5d shows, the oxide film formed on the topmost surface of the p⁻-substrate 1, and a thickness of several ten nanometers of the LOCOS oxide film 8 are removed. Then, on the n⁻-diffused layer 5 and the p-layer 9, corresponding to the CMOS transistor portion, an oxide film (gate oxide film) 10 of a thickness of 10 to 50 nm is formed.

On the entire surface of the p⁻-substrate 1, a polysilicon film 11 and a tungsten silicide film 12 are sequentially deposited. Furthermore, a resist is applied thereon, and patterning is performed to remove unnecessary part of the polysilicon film 11 and tungsten silicide film 12. Thereby, the gate electrode structure as the heat storage layer of the resistor portion, and the gate electrode portion of the CMOS transistor are formed.

Thereafter, the resist is applied thereon, patterning is performed, and phosphorus is rotationally implanted by 45° into a portion corresponding to the n-channel portion of the CMOS transistor, to form an n⁻-diffused layer 13 on the p-layer 9.

Next, as FIG. 6a shows, the resist applied to the topmost surface in the previous process is removed, and an oxide film is deposited on the area from which the resist has been removed. Then, anisotropic etching is performed to form sidewalls 14 on the sides of the gate electrode portion comprising a polysilicon film 11 and a tungsten silicide film 12 formed in the previous process.

At this time, the oxide film 10 remaining on the surface of the n⁻-diffused layer 5 and the p-layer 9 of the CMOS transistor portion is removed.

Then, after photoengraving has been performed, and arsenic is implanted in a part of the n⁻-diffused layer 13, and is driven in a nitrogen atmosphere at 900° C. to form an n⁺-diffused layer 15.

Then, in a p-channel side part of the n⁻-diffused layer 5, BF₂ is implanted to form a p⁺-diffused layer 16.

Next, as FIG. 6b shows, a polysilicon film 22 is deposited on the topmost surface of the p⁻-substrate 1. A polysilicon film of a thickness of several hundred nanometers is further deposited, and an impurity such as boron is implanted into the entire surface of the polysilicon film. Then, a resist is applied to the impurity-implanted polysilicon film, and patterning is performed to form a desired polysilicon resistor layer 20 corresponding to the resistor portion.

Finally as FIG. 6c shows, an oxide film layer 17 of a thickness of about 800 nm is formed on the topmost surface of the p⁻-substrate 1. Then, photoengraving is performed to remove the unnecessary parts of the oxide film layer 17, and to form desired contact holes 18. Then, an aluminum film is formed on the entire topmost surface by sputtering, and photoengraving is performed to remove the unnecessary parts of the aluminum film. Thereby, desired aluminum electrodes 19 are formed. Here, among six aluminum electrodes 19 formed in this, process, two from the right of the drawing become the p-channel source/drain electrodes of the CMOS transistor, two in the center of the drawing become the n-channel source/drain electrodes, and two from the left of the drawing become the electrodes for resistors.

According to Second Embodiment, as described above, even if a surge current flows in the polysilicon resistor layer 20, since the heat generated therein is stored in the laminated film consisting of the polysilicon film 11 and the tungsten silicide film 12, a stable and reliable semiconductor device that has an electric resistor portion resistant to the breakdown of the polysilicon resistor layer 20 can be provided.

Also, such a semiconductor device can be manufactured in relatively simple manufacturing process steps as in First Embodiment, together with the process for forming a CMOS transistor.

In Second Embodiment, the laminated film (laminated gate electrode structure) comprising the polysilicon film 11 and the tungsten silicide film 12 is used as the heat storage layer. However, the present invention is applicable to a laminated gate electrode structure comprising other silicide films, such as a titanium silicide film; or to a single-layer gate electrode structure.

Third Embodiment

Third Embodiment of the present invention will be described in detail below referring to FIGS. 7 to 9.

Figure 7:
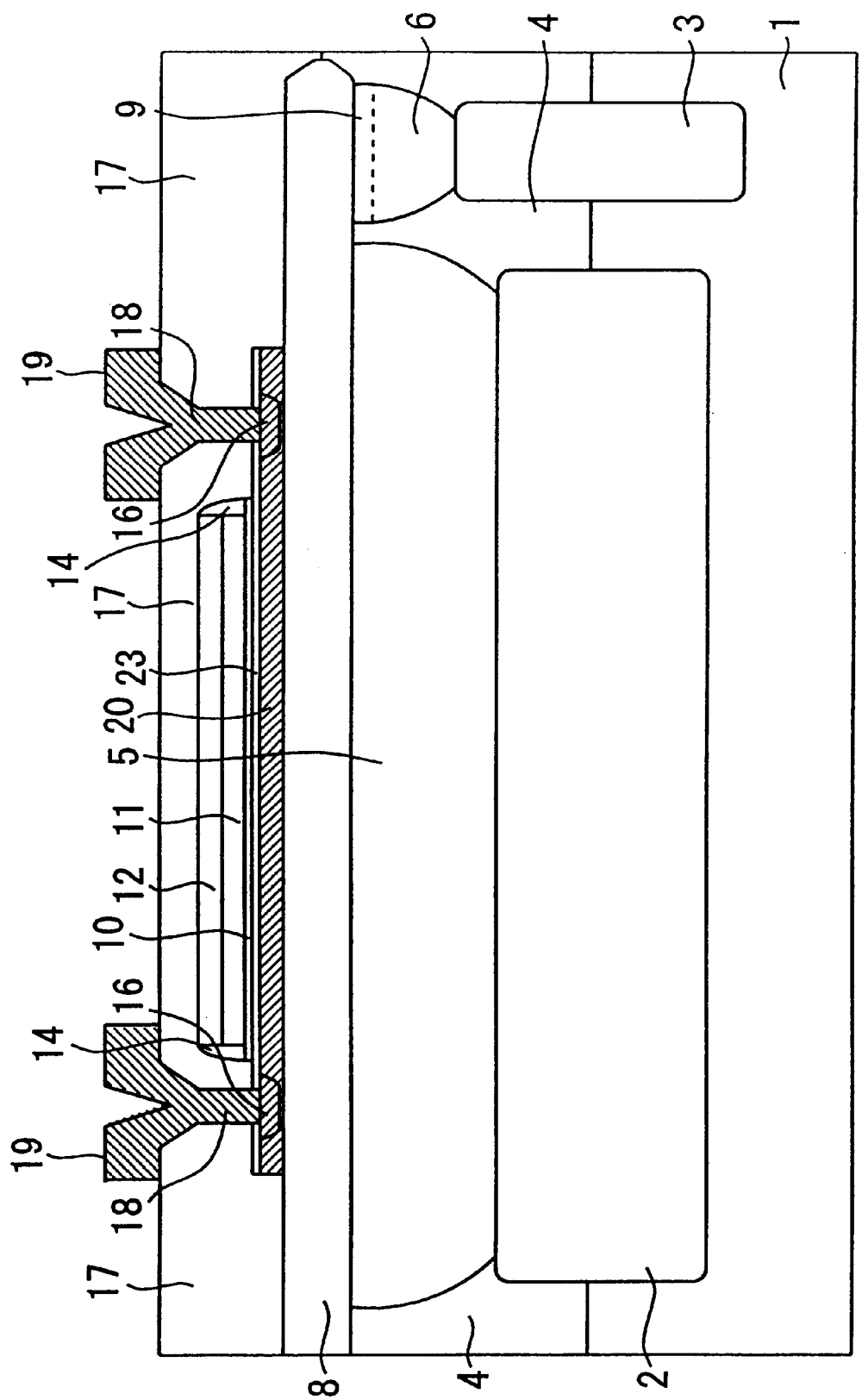
FIG. 7 is a schematic sectional view showing a semiconductor device of Third Embodiment.

FIG. 7 is a schematic sectional view showing a semiconductor device of Third Embodiment. Third Embodiment is different from Second Embodiment in that a laminated film (laminated gate electrode structure) as a heat storage layer is formed above the polysilicon resistor layer 20, while the laminated film in Second Embodiment is formed underneath the polysilicon resistor layer 20.

In FIG. 7, the reference numeral 1 represents a p⁻-substrate, 8 represents an LOCOS oxide film as a first insulating layer, 10 represents an oxide film as a thin film insulating layer portion, 11 represents a polysilicon film, 12 represents a tungsten silicide film, 14 represents sidewalls, 16 represents p⁺-diffused layers, 17 represents an oxide film layer, 18 represents contact holes, 19 represents aluminum electrodes, 20 represents a polysilicon resistor layer, and 23 represents a nitride film formed on the polysilicon resistor layer 20. Here, the thickness of each of the nitride film 23 and the oxide layer 10 formed on the upper surface of the polysilicon resistor layer 20 is several ten nanometers.

In Third Embodiment, the oxide film layer 17 and the oxide film 10 constitute a second insulating layer.

As described above, the semiconductor device according to Third Embodiment is a semiconductor device comprising an LOCOS oxide film (first insulating layer) 8 formed on a p⁻-substrate 1; a polysilicon resistor layer 20 having a prescribed electric resistance formed on the LOCOS oxide film 8; an oxide film layer (second insulating layer) 17 formed on the polysilicon resistor layer 20; and a plurality of aluminum electrodes (wirings) 19 electrically connected, at positions spaced a part from each other on the polysilicon resistor layer 20, to the polysilicon resistor layer 20 through contact holes 18 formed in the oxide film layer 17; an oxide film (thin film insulating layer portion) 10 formed on the surface of the polysilicon resistor layer 20; and a laminated film (heat storage layer) consisting of a polysilicon film 11 and a tungsten silicide film 12 contacting the upper surface of the oxide film 10.

In the semiconductor device constituted as described above, when a current flows in the polysilicon resistor layer 20, no current flows toward the bottom surface side, because the LOCOS oxide layer 8 of a sufficient thickness has been formed on the bottom surface side of the polysilicon resistor layer 20. Also, although the oxide film 10 of low insulation is formed on the upper surface side of the polysilicon resistor layer 20, since the laminated film (gate electrode structure) is formed on the upper surface of the oxide film 10, and furthermore, the oxide film layer 17 of a sufficient thickness is formed on the upper surface of the laminated film, no current flows also toward the upper surface side. Therefore, the structure as an electric resistance according to Third Embodiment plays a role of an inherent electric resistance sufficiently.

Also, even if a surge current flows in the polysilicon resistor layer 20, and a large heat is generated in the polysilicon resistor layer 20, the oxide film 10, which has a low thermal conductivity, can dissipate the heat to the tungsten silicide film 12 and the polysilicon film 11, because the oxide film 10 has been formed to be extremely thin. Thereby, the heat generated in the polysilicon resistor layer 20 is dissipated, and the temperature of the polysilicon resistor layer 20 becomes difficult to elevate.

Next, a method for manufacturing a semiconductor of Third Embodiment will be described below referring to FIGS. 8a to 8d and 9a to 9c. FIGS. 8a to 8d are schematic sectional views showing the semiconductor device in each of the manufacturing process step, and FIGS. 9a to 9c are schematic sectional views showing the semiconductor device in each of the continuing manufacturing process steps.

Figure 8A:
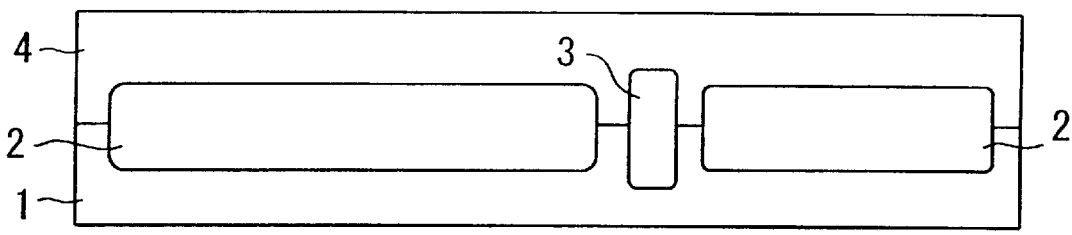
FIGS. 8a to 8d are schematic sectional views showing the semiconductor device in each of the manufacturing process step.
Figure 8B:
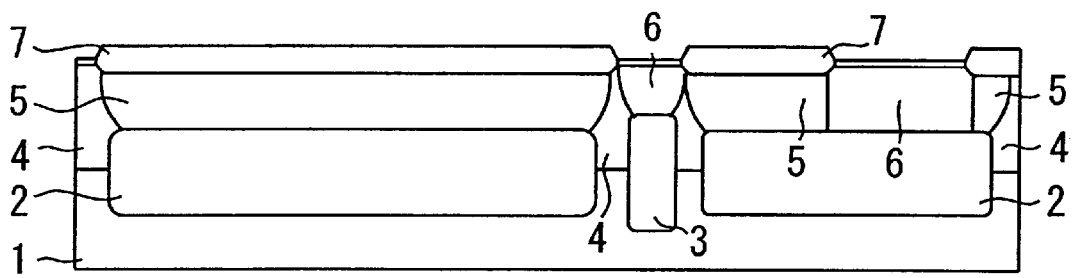
Figure 8C:
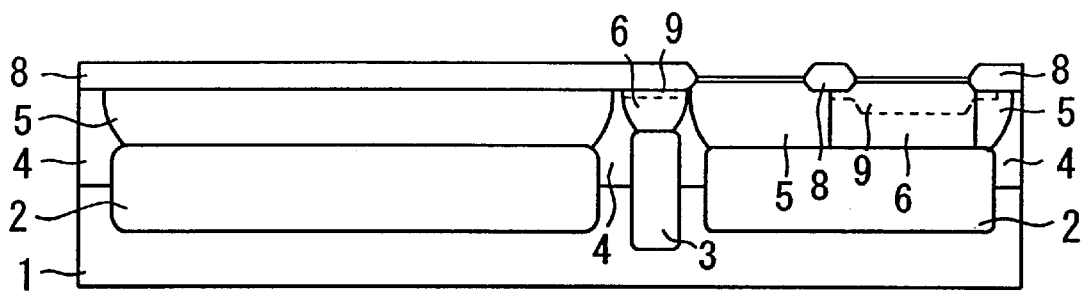

First, in the process steps shown in FIGS. 8a to 8c are the same as the process steps shown in FIGS. 5a to 5c for Second Embodiment.

Figure 8D:
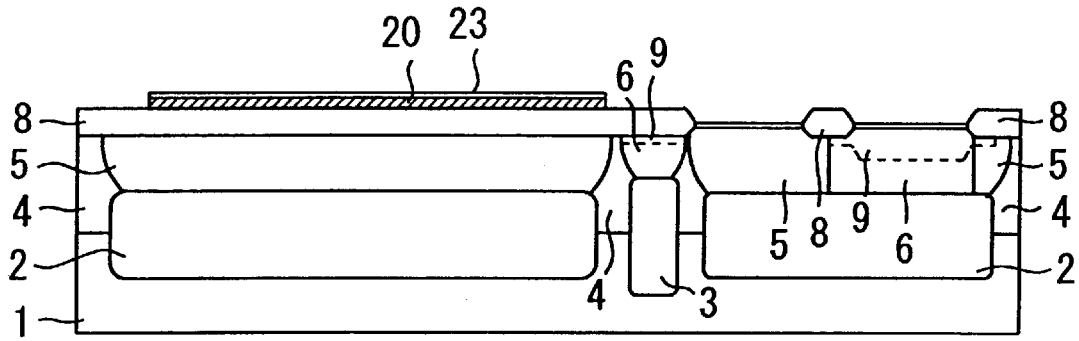

Next, as FIG. 8d shows, a polysilicon film is deposited on the entire topmost surface of the p$^-$-substrate 1, and an impurity such as boron is implanted into the entire surface of the polysilicon film. A nitride film is further deposited thereon. Then, a resist is applied to the nitride film, and patterning is performed to form a desired polysilicon resistor layer 20 corresponding to the resistor portion, and a nitride film 23.

Figure 9A:
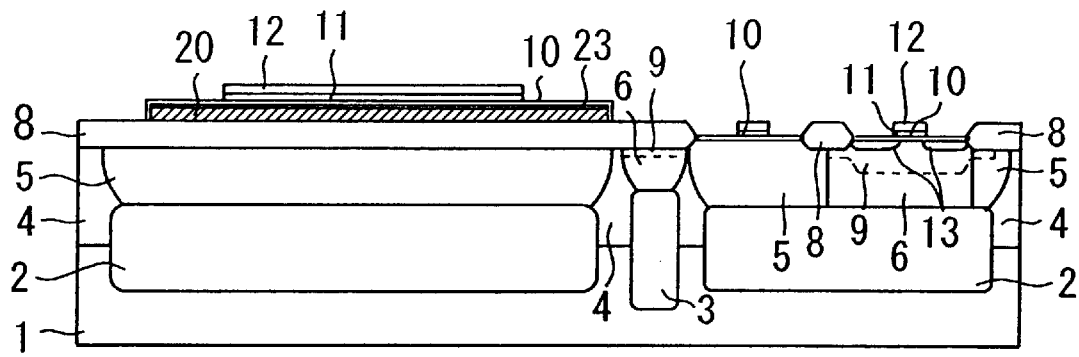
FIGS. 9a to 9c are schematic sectional views showing the semiconductor device in each of the continuing manufacturing process steps.
Figure 9B:
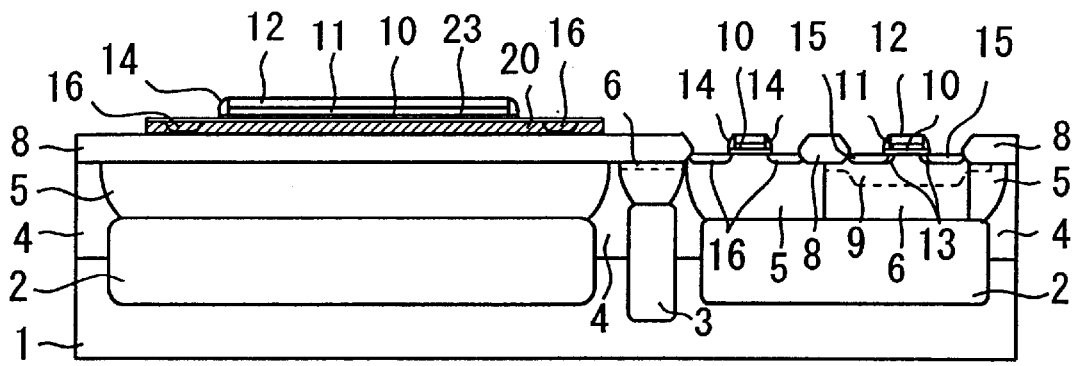
Figure 9C:
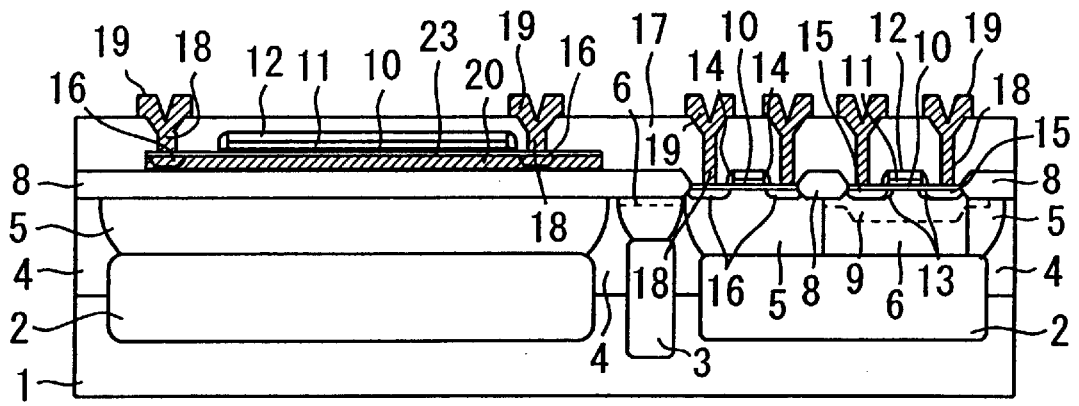

Next, as FIG. 9a shows, the oxide film formed on the topmost surface of the p$^-$-substrate 1, and a thickness of several ten nanometers of the LOCOS oxide film 8 are removed. Then, on the polysilicon resistor layer 20 corresponding to the resistor portion and the n$^-$-diffused layer 5 and the p-layer 9 corresponding to the CMOS transistor portion, an oxide film 10 of a thickness of 10 to 50 nm is formed.

On the entire topmost surface of the p$^-$-substrate 1, a polysilicon film 11 and a tungsten silicide film 12 are sequentially deposited. Furthermore, a resist is applied thereon, and patterning is performed to remove unnecessary part of the polysilicon film 11 and tungsten silicide film 12. Thereby, the gate electrode structure as the heat storage layer of the resistor portion, and the gate electrode portion of the CMOS transistor portion are formed.

Thereafter, the resist is applied thereon, patterning is performed, and phosphorus is rotationally implanted by 45° into the portion corresponding to the n-channel portion of the CMOS transistor, to form an n$^-$-diffused layer 13 on the p-layer 9.

Next, as FIG. 9b shows, the resist applied to the topmost surface in the previous process is removed, and an oxide film is deposited on the area from which the resist has been removed. Then, anisotropic etching is performed to form sidewalls 14 on the sides of the gate electrode portion comprising a polysilicon film 11 and a tungsten silicide film 12 formed in the previous process.

At this time, the oxide film 10 remaining on the, surfaces of the n$^-$-diffused layer 5 and the p-layer 9 of the CMOS transistor portion is removed.

Then, after photoengraving has been performed, and arsenic is implanted in a part of the n$^-$-diffused layer 13, and is driven in a nitrogen atmosphere at 900° C. to form an n$^+$-diffused layer 15.

Then, in a p-channel side part of the n$^-$-diffused layer 5, BF$_2$ is implanted to form a p$^+$-diffused layer 16.

Finally as FIG. 9c shows, an oxide film layer 17 is formed on the topmost surface of the p$^-$-substrate 1. Then, photoengraving is performed to remove the unnecessary parts of the oxide film layer 17, and to form desired contact holes 18. Then, an aluminum film is formed on the entire topmost surface by sputtering, and photoengraving is performed to remove the unnecessary parts of the aluminum film. Thereby, desired aluminum electrodes 19 are formed.

As described above, according to Third Embodiment as in Second Embodiment, even if a surge current flows in the polysilicon resistor layer 20, since the heat generated therein is stored in the laminated film consisting of the polysilicon film 11 and the tungsten silicide film 12, a stable and reliable semiconductor device that has an electric resistor portion resistant to the breakdown of the polysilicon resistor layer 20 can be provided.

Also, such a semiconductor device can be manufactured in relatively simple manufacturing process steps as in Second Embodiment, together with the process for forming a CMOS transistor.

Fourth Embodiment

Fourth Embodiment of the present invention will be described in detail below referring to FIGS. 10 to 12.

Figure 10:
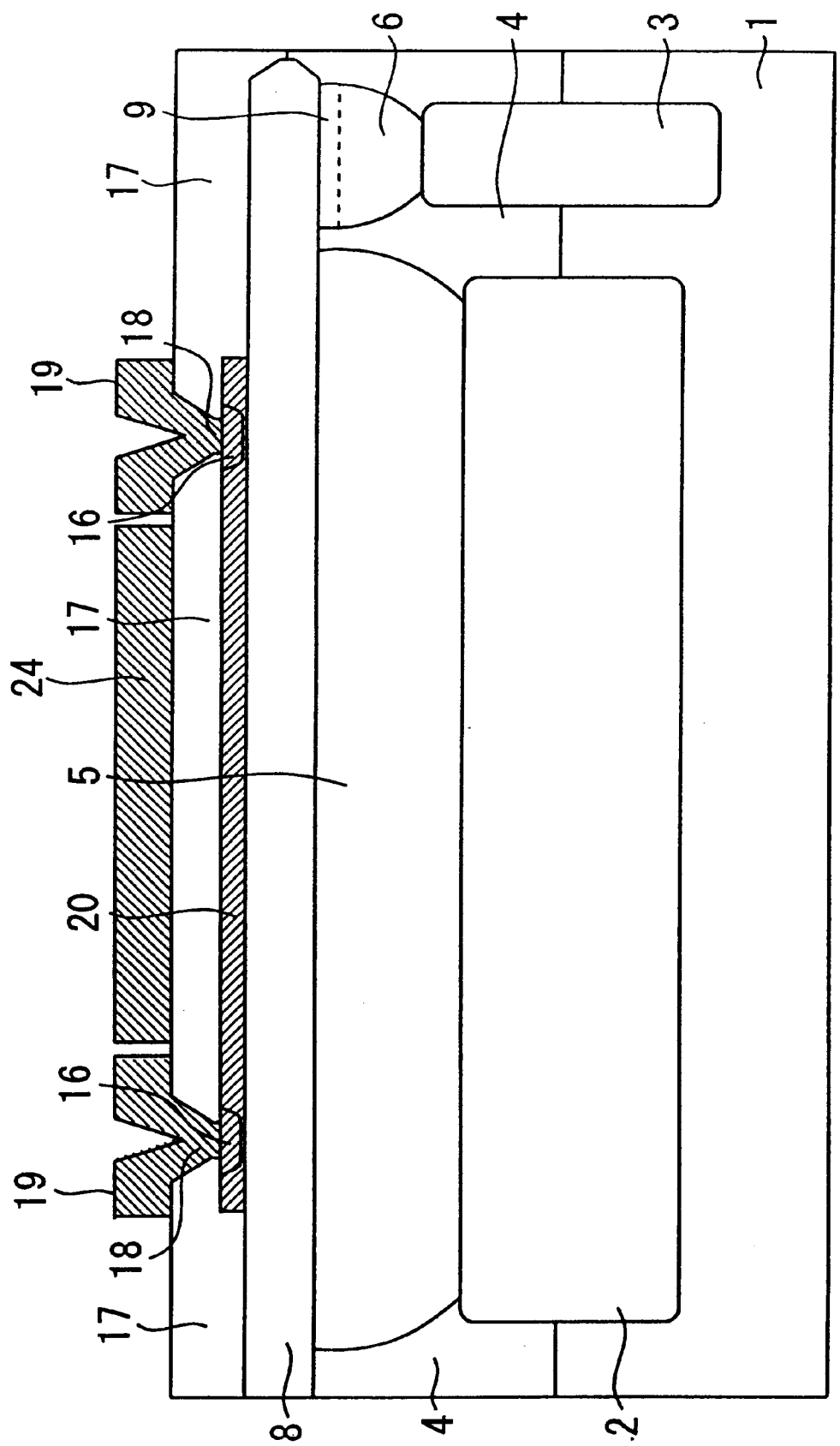
FIG. 10 is a schematic sectional view showing a semiconductor device of Fourth Embodiment.

FIG. 10 is a schematic sectional view showing a semiconductor device of Fourth Embodiment. Fourth Embodiment is different from the above-described embodiments in that an aluminum layer 24 as a heat storage layer is formed above the polysilicon resistor layer 20 via an oxide layer 17.

In FIG. 10, the reference numeral 1 represents a p$^-$-substrate, 8 represents an LOCOS oxide film as a first insulating layer, 16 represents p$^+$-diffused layers, 17 represents an oxide film layer as a second insulating layer, 18 represents contact holes, 19 represents aluminum electrodes, 20 represents a polysilicon resistor layer, and 24 represents an aluminum layer as a metal layer.

In the semiconductor device constituted as described above, when a current flows in the polysilicon resistor layer 20, no current flows toward the upper and bottom surface sides, because the oxide film layer 17 and the LOCOS oxide layer 8 of a sufficient thickness have been formed on the upper and bottom surface sides of the polysilicon resistor layer 20. Therefore, the structure as an electric resistance according to Fourth Embodiment plays a role of an inherent electric resistance sufficiently.

Also, when a surge current flows in the polysilicon resistor layer 20 to generate a large heat in the polysilicon resistor layer 20, the temperature of the oxide film layer 17 on the polysilicon resistor layer 20 is elevated accordingly. However, since an aluminum layer 24 of a high thermal conductivity is formed on the oxide film layer 17, the heat can be dissipated. Thereby, the heat generated in the polysilicon resistor layer 20 is dissipated, and the temperature of the polysilicon resistor layer 20 becomes difficult to elevate.

Next, a method for manufacturing a semiconductor of Fourth Embodiment will be described below referring to FIGS. 11a to 11d and 12a to 12c. FIGS. 11a to 11d are schematic sectional views showing the semiconductor device in each of the manufacturing process step, and FIGS. 12a to 12c are schematic sectional views showing the semiconductor device in each of the continuing manufacturing process steps.

Figure 11A:
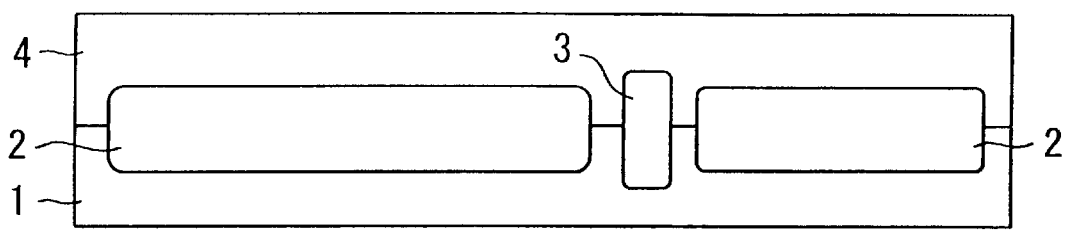
FIGS. 11a to 11d are schematic sectional views showing the semiconductor device in each of the manufacturing process step.
Figure 11B:
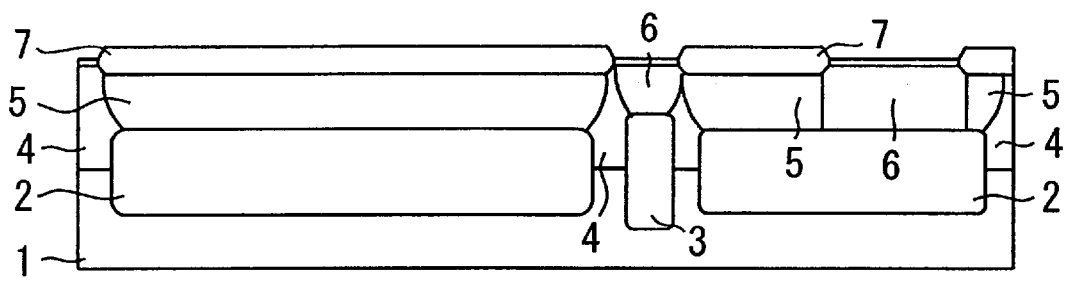
Figure 11C:
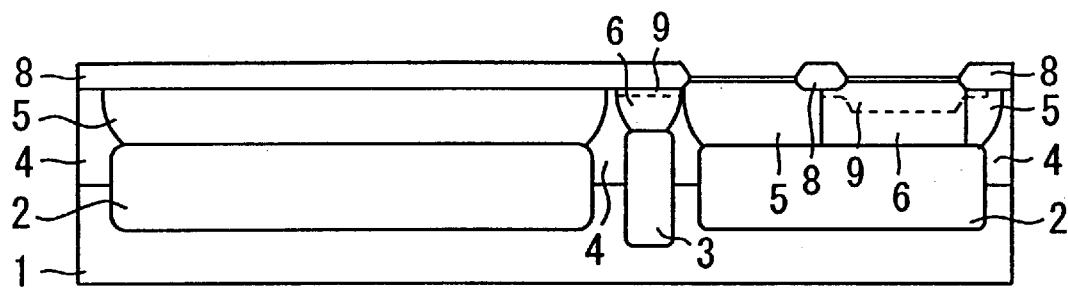

First, in the process steps shown in FIGS. 11a to 11c are the same as the process steps shown in FIGS. 5a to 5c for Second Embodiment.

Figure 11D:
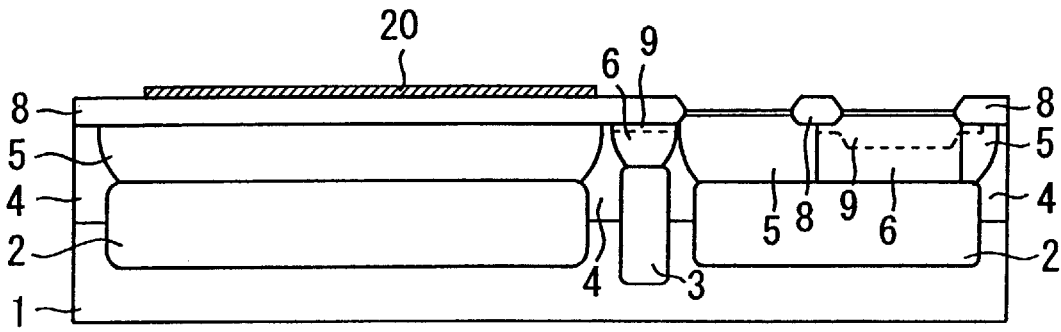

Next, as FIG. 11d shows, a polysilicon film is deposited on the entire topmost surface of the p⁻-substrate 1, and an impurity such as boron is implanted into the entire surface of the polysilicon film. Then, a resist is applied thereon, and patterning is performed to form a desired polysilicon resistor layer 20 corresponding to the resistor portion.

Figure 12A:
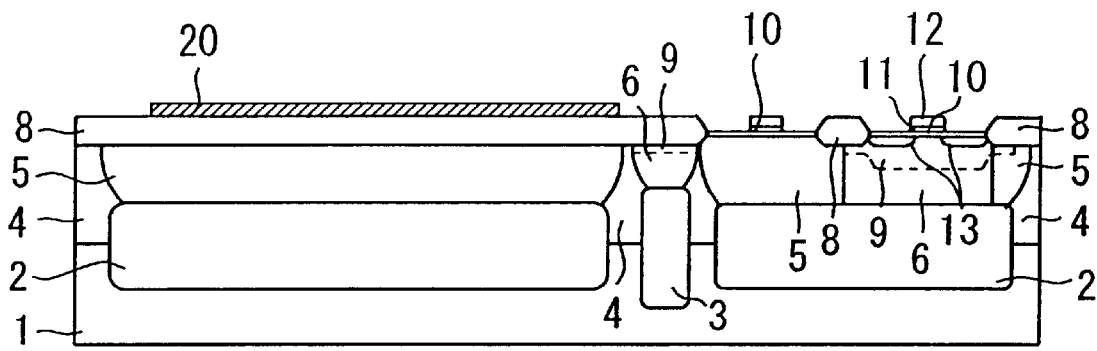
FIGS. 12a to 12c are schematic sectional views showing the semiconductor device in each of the continuing manufacturing process steps.
Figure 12B:
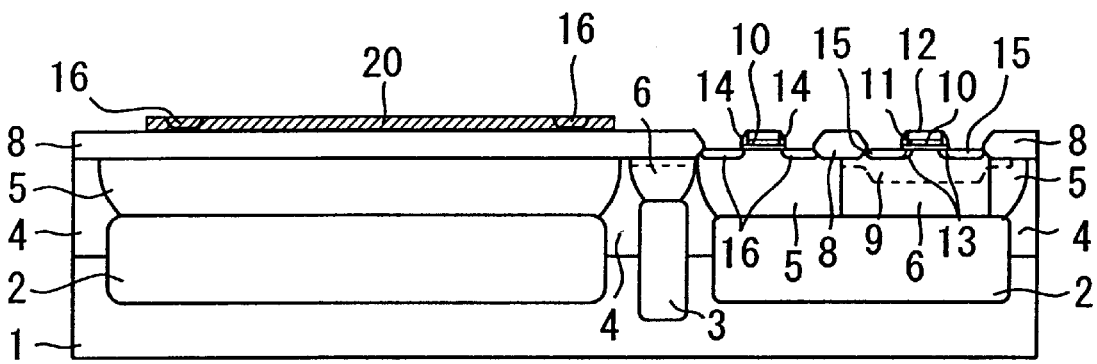
Figure 12C:
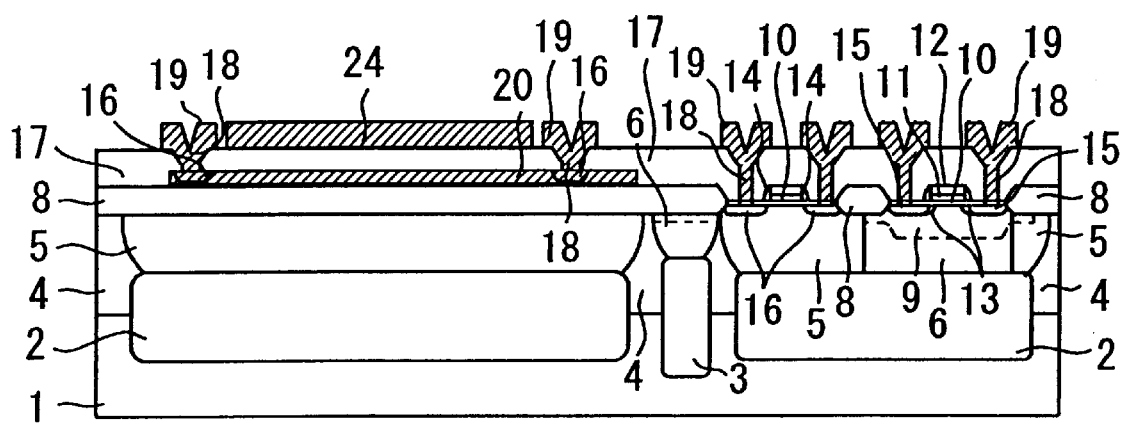

Next, as FIG. 12a shows, the oxide film formed on the topmost surface of the p⁻-substrate 1, and a thickness of several ten nanometers of the LOCOS oxide film 8 are removed. Then, on the n⁻-diffused layer 5 and the p-layer 9, corresponding to the CMOS transistor portion, an oxide film 10 of a thickness of 10 to 50 nm is formed.

On the entire topmost surface of the p⁻-substrate 1, a polysilicon film 11 and a tungsten silicide film 12 are sequentially deposited. Furthermore, a resist is applied thereon, and patterning is performed to remove unnecessary part of the polysilicon film 11 and tungsten silicide film 12. Thereby, the gate electrode portion of the CMOS transistor are formed.

Thereafter, the resist is applied thereon, patterning is performed, and phosphorus is rotationally implanted by 45° into the portion corresponding to the n-channel portion of the CMOS transistor, to form an n⁻-diffused layer 13 on the p-layer 9.

Next, as FIG. 12b shows, the resist applied to the topmost surface in the previous process is removed, and an oxide film is deposited on the area from which the resist has been removed. Then, anisotropic etching is performed to form sidewalls 14 on the sides of the gate electrode portion comprising a polysilicon film 11 and a tungsten silicide film 12 formed in the previous process.

At this time, the oxide film 10 remaining on the surfaces of the n⁻-diffused layer 5 and the p-layer 9 of the CMOS transistor portion is removed.

Then, after photoengraving has been performed, and arsenic is implanted in a part of the n⁻-diffused layer 13, and is driven in a nitrogen atmosphere at 900° C. to form an n⁺-diffused layer 15.

Then, in a p-channel side part of the n⁻-diffused layer 5, BF₂ is implanted to form a p⁺-diffused layer 16.

Finally as FIG. 12c shows, an oxide film layer 17 is formed on the topmost surface of the p⁻-substrate 1. Then, photoengraving is performed to remove the unnecessary parts of the oxide film layer 17, and to form desired contact holes 18. Then, an aluminum film is formed on the entire topmost surface by sputtering, and photoengraving is performed to remove the unnecessary parts of the aluminum film. Thereby, an aluminum layer 24 as the heat storage layer, and aluminum electrodes 19 as electrodes are formed.

As described above, according to Fourth Embodiment, even if a surge current flows in the polysilicon resistor layer 20, the heat of the oxide layer 17 generated accordingly is stored in the aluminum layer 24, and therefore a stable and reliable semiconductor device that has an electric resistor portion resistant to the breakdown of the polysilicon resistor layer 20 can be provided.

Also, such a semiconductor device can be manufactured in relatively simple manufacturing process steps, together with the process for forming a CMOS transistor.

Although an aluminum layer 24 is used as a heat storage layer in Fourth Embodiment, other materials having high thermal conductivity and heat-dissipating characteristics can be used in place of the aluminum layer 24.

Fifth Embodiment

Fifth Embodiment of the present invention will be described in detail below referring to FIG. 13.

Figure 13:
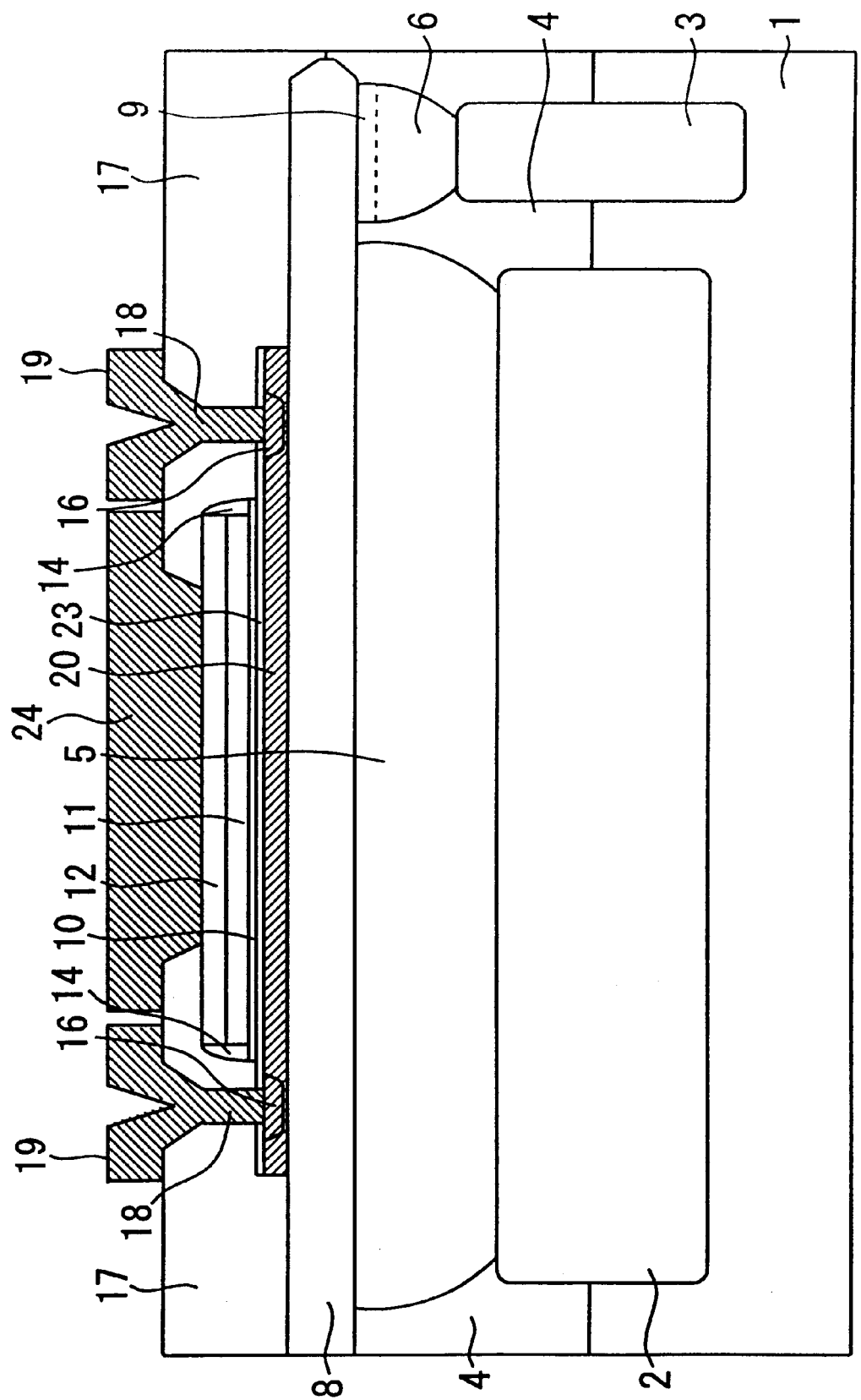
FIG. 13 is a schematic sectional view showing a semiconductor device of Fifth Embodiment.

FIG. 13 is a schematic sectional view showing a semiconductor device of Fifth Embodiment. In Fifth Embodiment, the above-described laminated gate electrode structure of Third Embodiment, and the above-described aluminum layer 24 of Fourth Embodiment are formed as the heat storage layer.

In FIG. 13, the reference numeral 1 represents a p⁻-substrate, 8 represents an LOCOS oxide film as a first insulating layer, 10 represents an oxide film as a thin film insulating portion, 11 represents a polysilicon film, 12 represents a tungsten silicide film, 14 represents sidewalls, 16 represents p⁺-diffused layers, 17 represents an oxide film layer as a second insulating layer, 18 represents contact holes, 19 represents aluminum electrodes, 20 represents a polysilicon resistor layer, and 24 represents an aluminum layer as a heat storage layer.

Here, the aluminum layer 24 is formed in the opening formed in the oxide film layer 17. More specifically, in the process step for forming aluminum electrodes 19, photoengraving is performed to form a hole also above the polysilicon resistor layer 20 in the oxide film layer 17 in addition to holes for electrode portions, and the aluminum layer 24 is formed through the hole. At this time, the aluminum layer 24 is formed so as to contact the upper surface of the tungsten silicide film 12 formed on the polysilicon resistor layer 20.

In the semiconductor device constituted as described above, even if a surge current flows in the polysilicon resistor layer 20, and the temperature of the polysilicon resistor layer 20 is elevated, the heat of the polysilicon resistor layer 20 is stored in the polysilicon film 11 and the tungsten silicide film 12 which constitute the laminated film, as described above in Third Embodiment. Furthermore, the heat stored in the polysilicon film 11 and the tungsten silicide film 12 is dissipated to the aluminum layer 24 contacting the laminated structure. Thus, heat generated in the polysilicon resistor layer 20 is dissipated, and a stable and reliable semiconductor device having the polysilicon resistor layer 20 hard to increase in temperature resulting in a less breakable electric resistor portion can be provided.

Sixth Embodiment

Sixth Embodiment of the present invention will be described in detail below referring to FIG. 14.

Figure 14:
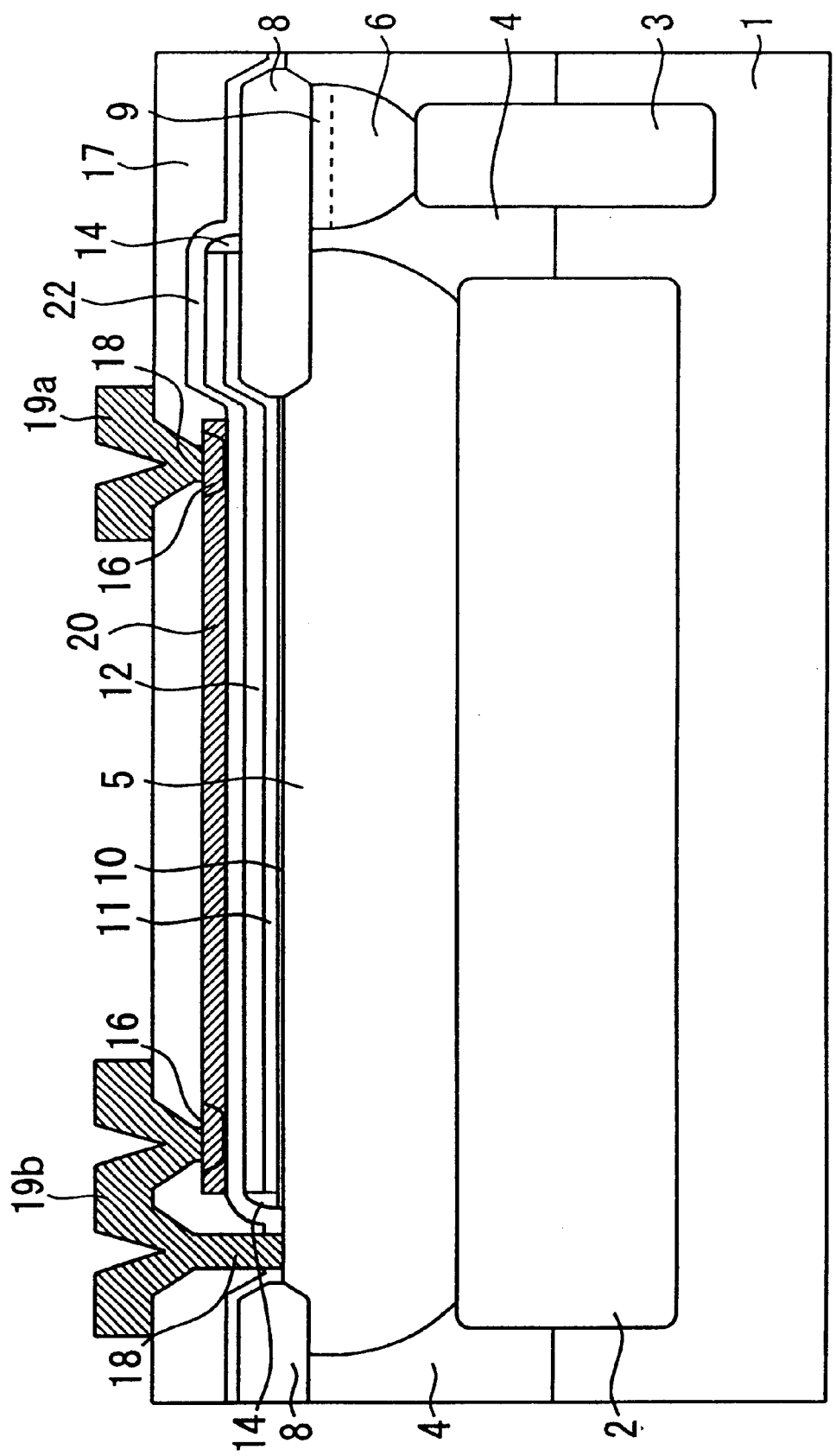
FIG. 14 is a schematic sectional view showing a semiconductor device of Sixth Embodiment.
Figure 15:
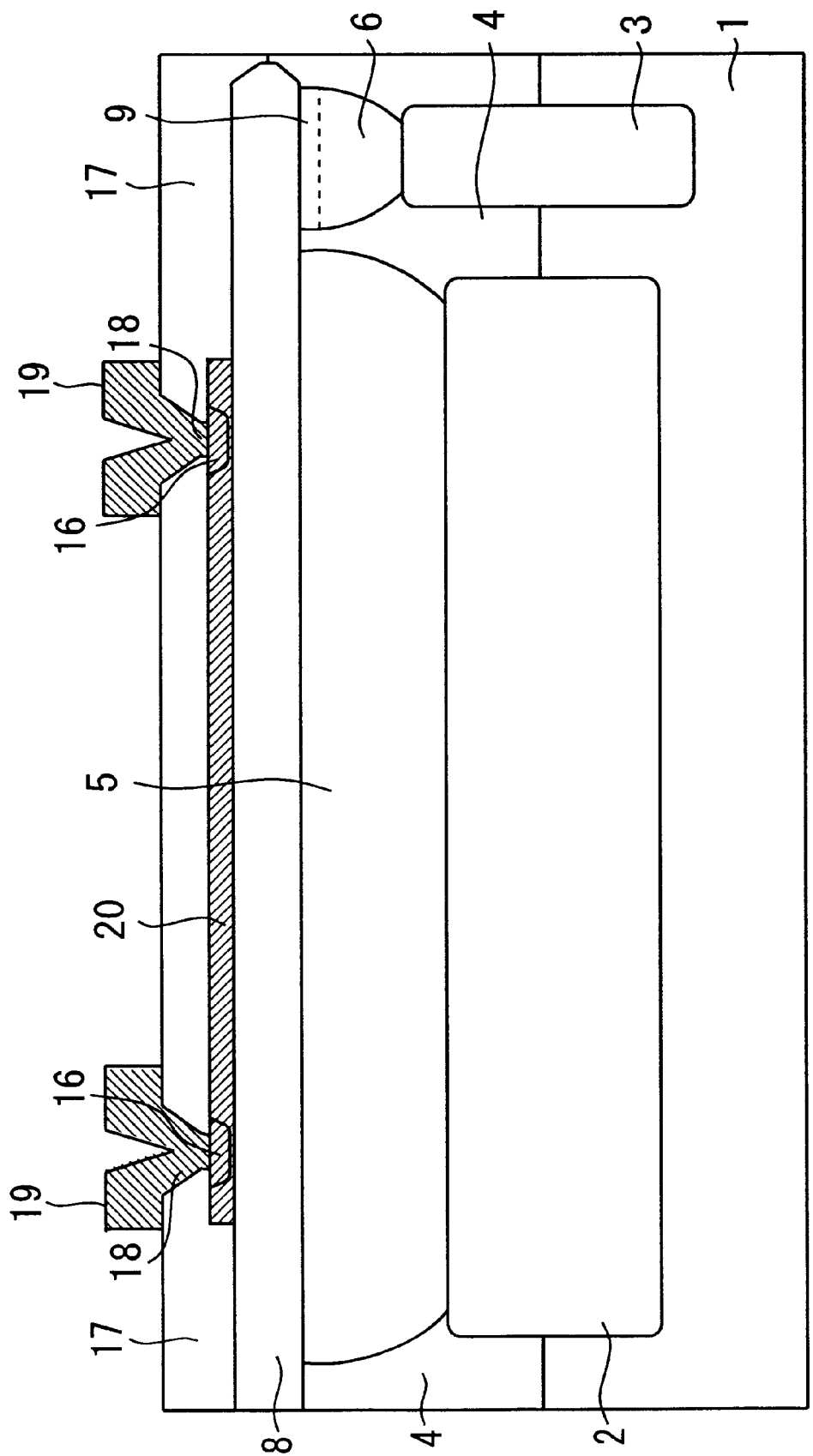
FIG. 15 is a schematic sectional view of a conventional semiconductor device having a polysilicon resistor layer.
Figure 16A:
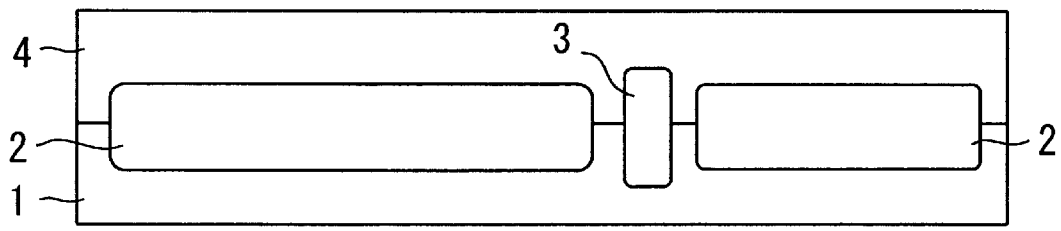
FIGS. 16a to 16d are schematic sectional views showing the semiconductor device in each of conventional manufacturing process steps.
Figure 16B:
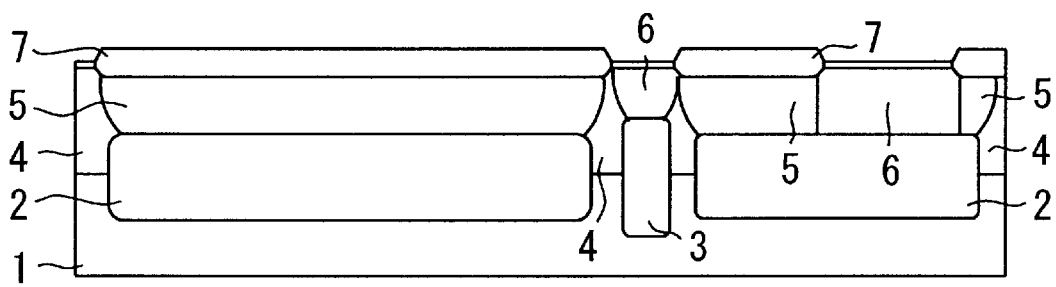
Figure 16C:
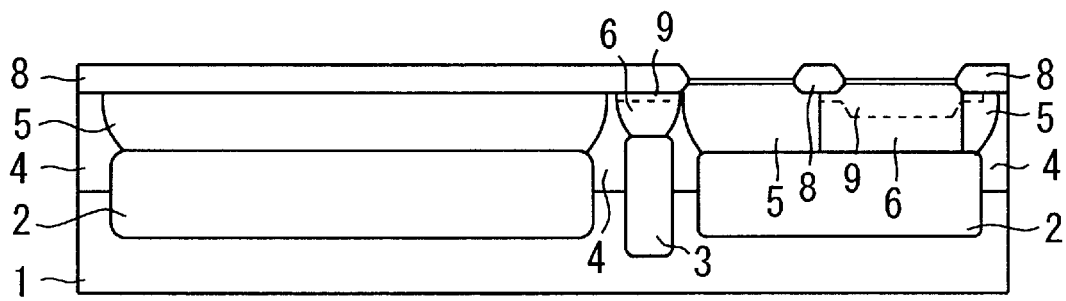
Figure 16D:
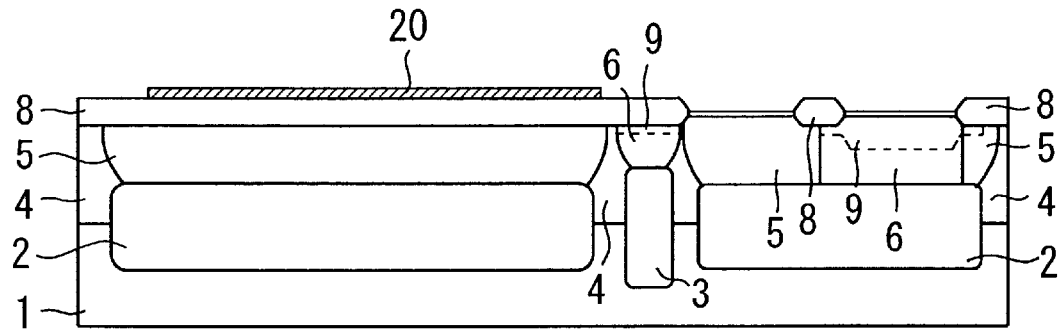
Figure 17A:
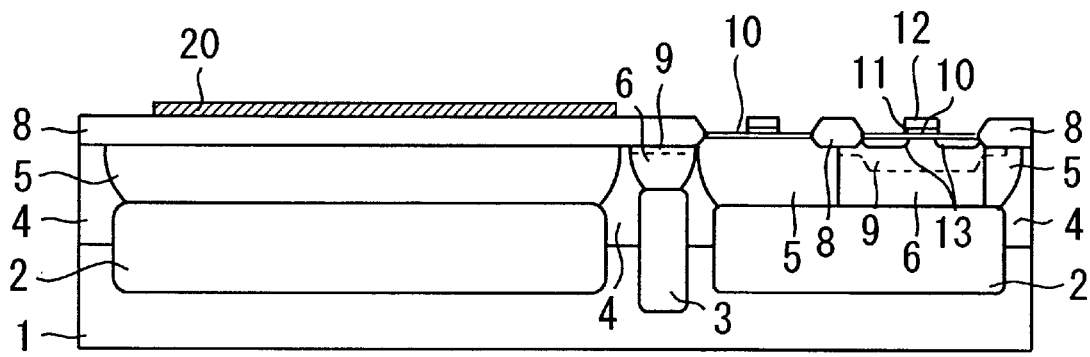
FIGS. 17a to 17c are schematic sectional views showing the semiconductor device in each of the continuing manufacturing process steps.
Figure 17B:
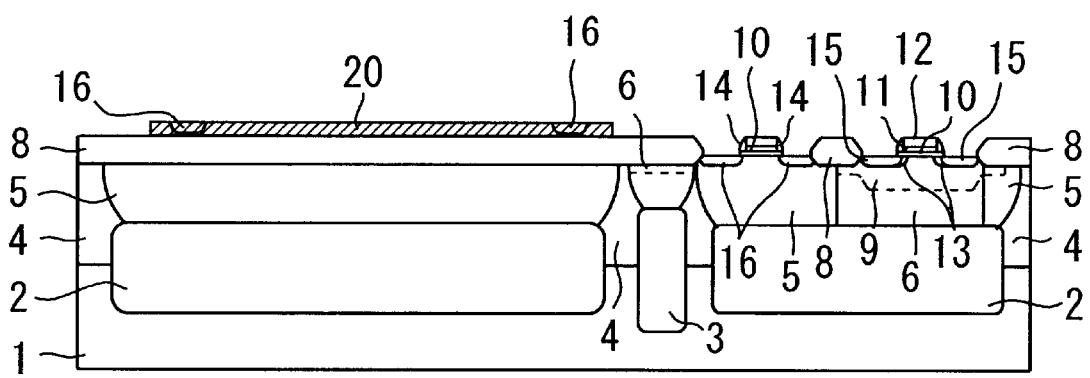
Figure 17C:
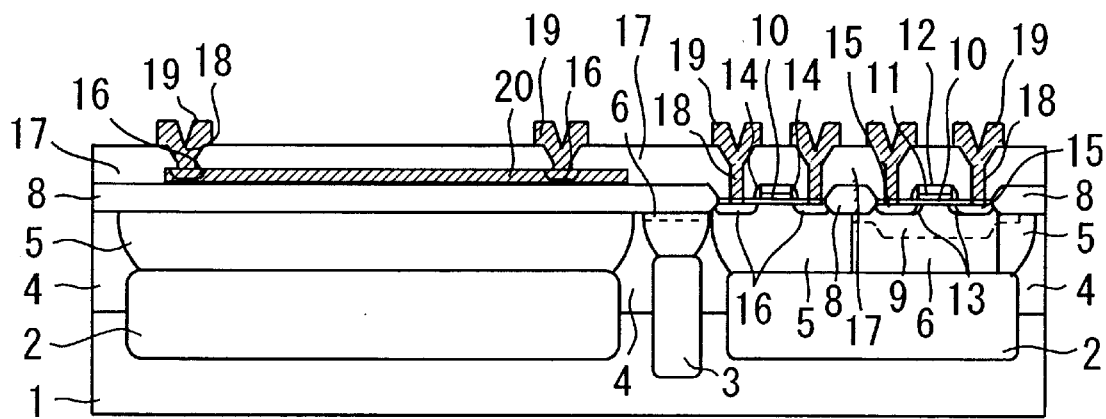

FIG. 14 is a schematic sectional view showing a semiconductor device of Sixth Embodiment. In Sixth Embodiment, an n⁻-diffused layer 5 of the above-described First Embodiment, and a laminated gate electrode structure in Second Embodiment are formed as the heat storage layer.

In FIG. 14, the reference numeral 1 represents a p⁻-substrate, 8 represents an LOCOS oxide film as a first insulating layer, 10 represents an oxide film, 11 represents a polysilicon film, 12 represents a tungsten silicide film, 14 represents sidewalls, 16 represents p⁺-diffused layers, 17 represents an oxide film layer as a second insulating layer, 18 represents contact holes, 19a and 19b represent aluminum electrodes, 20 represents a polysilicon resistor layer, and 22 represents an oxide film as a thin film insulating layer portion.

Here, an n⁻-diffused layer 5 as a heat storage layer is formed on the p⁻-substrate 1 in the same process step as in above-described First Embodiment. Furthermore, a polysilicon film 11 and a tungsten silicide film 12 as another heat storage layer are formed thereon in the same process step as in above-described Second Embodiment, and an oxide film 22 as a thin film insulating layer portion is formed on the tungsten silicide film 12.

As described above, the semiconductor device according to Sixth Embodiment is a semiconductor device comprising an LOCOS oxide film (first insulating layer) 8 formed on a p⁻-substrate 1; a polysilicon resistor layer 20 having a prescribed electric resistance formed on the LOCOS oxide film 8; an oxide film layer (second insulating layer) 17 formed on the polysilicon resistor layer 20; and a plurality of aluminum electrodes (wirings) 19a, 19b electrically connected, at positions spaced a part from each other on the polysilicon resistor layer 20, to the polysilicon resistor layer 20 through contact holes 18 formed in the oxide film layer 17; an oxide film (thin film insulating layer portion) 22 contacting the bottom surface of the polysilicon resistor layer 20; a laminated film (heat storage layer) consisting of a polysilicon film 11 and a tungsten silicide film 12 contacting the bottom surface of the oxide layer 22; and an n⁻-diffused layer 5 (heat storage layer) formed underneath the laminated film consisting of a polysilicon film 11 and a tungsten silicide film 12 so that the n⁻- diffused layer 5 is electrically connected to the aluminum wiring 19b.

In the semiconductor device constituted as described above, even if a surge current flows in the polysilicon resistor layer 20, and the temperature of the polysilicon resistor layer 20 is elevated, the heat of the polysilicon resistor layer 20 is stored in the polysilicon film 11 and the tungsten silicide film 12 which constitute the laminated film, as described above in Second Embodiment. Furthermore, the heat stored in the polysilicon film 11 and the tungsten silicide film 12 is dissipated to the n⁻-diffused layer 5 through the extremely thin oxide film 10. Thus, heat generated in the polysilicon resistor layer 20 is dissipated, and a stable and reliable semiconductor device having the polysilicon resistor layer 20 hard to increase in temperature resulting in a less breakable electric resistor portion can be provided.

Furthermore, the combination of heat storage layers in the above-described embodiments may be used other than the combination of heat storage layers in above-described Embodiments 5 and 6, and in these cases, the same effects as in Embodiments 5 and 6 can be obtained.

In the semiconductor device, the first insulating layer or the second insulating layer may have a thin film insulating layer portion that has a thinner thickness where the first insulating layer or the second insulating layer contacts the resistor layer, and the heat storage layer contacts at least the thin film insulating layer portion.

In the semiconductor device, the first insulating layer may be an LOCOS oxide film, and the thin film insulating layer portion may be an underlying oxide film formed on the substrate when the LOCOS oxide film is formed.

In the semiconductor device, the heat storage layer may be an impurity-diffused layer formed on a portion of the substrate facing the resistor layer, and at least one of the plurality of wirings may be electrically connected to the impurity-diffused layer.

In the semiconductor device, the heat storage layer may be a laminated film consisting of a polysilicon film and a silicide film.

In the semiconductor device, the laminated film consisting of a polysilicon film and a silicide film may be formed on the resistor layer intervening the second insulating layer.

In the semiconductor device, a metal layer may be formed on the laminated film consisting of a polysilicon film and a silicide film by opening the second insulating layer.

In the semiconductor device, the laminated film consisting of a polysilicon film and a silicide film may be formed underneath the resistor layer intervening the first insulating layer.

Here, the semiconductor device may further comprise an impurity-diffused layer formed on the substrate underneath the laminated film consisting of a polysilicon film and a silicide film, wherein at least one of the plurality of wirings is electrically connected to the impurity-diffused layer.

In the semiconductor device, the heat storage layer may be a metal layer formed on the second insulating layer.

In the semiconductor device, the resistor layer may be a polysilicon resistor layer formed of polysilicon to which a non-conductor is added.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2001-160809, filed on May 29, 2001 including specification, claims, drawings and summary, on which the Convention priority of the present application is based, are incorporated herein by reference in its entirety.

What is claimed is:

1. A semiconductor device, comprising:

a first insulating layer formed on a substrate;

a resistor layer formed on said first insulating layer and having a prescribed electrical resistance;

a second insulating layer formed on said resistor layer;

a plurality of wirings electrically connected, at positions spaced part from each other on said resistor layer, to said resistor layer through holes formed in said second insulating layer; and a heat storage layer formed in sufficient proximity to said resistor layer for storing heat generated by said resistor layer when a current flows in said resistor layer.

2. A semiconductor device, comprising:

a first insulating layer formed on a substrate;

a resistor layer formed on said first insulating layer and having a prescribed electrical resistance;

a second insulating layer formed on said resistor layer;

a plurality of wirings electrically connected, at positions spaced a part from each other on said resistor layer, to said resistor layer through holes formed in said second insulating layer; and a heat storage layer formed in the vicinity of said resistor layer for storing heat generated when a current flows in said resistor layer, wherein said first insulating layer or said second insulating layer has a thin film insulating layer portion that has a thinner thickness where said-first insulating layer or said second insulating layer contacts said resistor layer, and said heat storage layer contacts at least said thin film insulating layer portion.

3. The semiconductor device according to claim 2, wherein said first insulating layer is an LOCOS oxide film, and said thin film insulating layer portion is an underlying oxide film formed on the substrate when said LOCOS oxide film is formed.

4. The semiconductor device according to claim 1, wherein said heat storage layer is an impurity-diffused layer formed on a portion of the substrate facing said resistor layer, and at least one of said plurality of wirings is electrically connected to said impurity-diffused layer.

5. The semiconductor device according to claim 1, wherein said heat storage layer is a laminated film consisting of a polysilicon film and a silicide film.

6. The semiconductor device according to claim 5, wherein said laminated film consisting of a polysilicon film and a silicide film is formed on said resistor layer intervening said second insulating layer.

7. The semiconductor device according to claim 6, wherein a metal layer is formed on said laminated film consisting of a polysilicon film and a silicide film by opening said second insulating layer.

8. The semiconductor device according to claim 5, wherein said laminated film consisting of a polysilicon film and a silicide film is formed underneath said resistor layer intervening said first insulating layer.

9. The semiconductor device according to claim 8, further comprising an impurity-diffused layer formed on the substrate underneath said laminated film consisting of a polysilicon film and a silicide film, wherein at least one of said plurality of wirings is electrically connected to said impurity-diffused layer.

10. The semiconductor device according to claim 3, wherein said heat storage layer is an impurity-diffused layer formed on a portion of the substrate facing said resistor layer, and at least one of said plurality of wirings is electrically connected to said impurity-diffused layer.

11. The semiconductor device according to claim 3, wherein said heat storage layer is a laminated film consisting of a polysilicon film and a silicide film.

12. The semiconductor device according to claim 11, wherein said laminated film consisting of a polysilicon film and a silicide film is formed on said resistor layer intervening said second insulating layer.

13. The semiconductor device according to claim 12, wherein a metal layer is formed on said laminated film consisting of a polysilicon film and a silicide film by opening said second insulating layer.

14. The semiconductor device according to claim 11, wherein said laminated film consisting of a polysilicon film and a silicide film is formed underneath said resistor layer intervening said first insulating layer.

15. The semiconductor device according to claim 14, further comprising an impurity-diffused layer formed on the substrate underneath said laminated film consisting of a polysilicon film and a silicide film, wherein at least one of said plurality of wirings is electrically connected to said impurity-diffused layer.

16. The semiconductor device according to claim 2, wherein said heat storage layer is an impurity-diffused layer formed on a portion of the substrate facing said resistor layer, and at least one of said plurality of wirings is electrically connected to said impurity-diffused layer.

17. The semiconductor device according to claim 2, wherein said heat storage layer is a laminated film consisting of a polysilicon film and a silicide film.

18. The semiconductor device according to claim 17, wherein said laminated film consisting of a polysilicon film and a silicide film is formed on said resistor layer intervening said second insulating layer.

19. The semiconductor device according to claim 1, wherein said heat storage layer is a metal layer formed on said second insulating layer.

20. The semiconductor device according to claim 1, wherein said resistor layer is a polysilicon resistor layer formed of polysilicon to which a non-conductor is added.

* * * * *